(12) United States Patent
Aoki

(10) Patent No.: US 6,466,838 B1
(45) Date of Patent: Oct. 15, 2002

(54) SEMICONDUCTOR EXPOSURE APPARATUS AND DEVICE MANUFACTURING METHOD USING THE SAME

(75) Inventor: Akio Aoki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/310,993

(22) Filed: May 13, 1999

(30) Foreign Application Priority Data

May 14, 1998 (JP) .......................................... 10-148286
Dec. 21, 1998 (JP) .......................................... 10-362206

(51) Int. Cl.$^7$ ............................................. G06F 19/00
(52) U.S. Cl. ........................ 700/121; 700/59; 250/492
(58) Field of Search ........................... 700/121, 59, 57, 700/118; 250/492

(56) References Cited

U.S. PATENT DOCUMENTS

| | | | | |
|---|---|---|---|---|
| 4,967,337 A | * | 10/1990 | English et al. ............... | 700/121 |
| 5,442,163 A | * | 8/1995 | Nakahara et al. ............ | 700/121 |
| 5,740,034 A | * | 4/1998 | Saceki ......................... | 700/121 |
| 5,825,470 A | * | 10/1998 | Miyai et al. ................... | 355/72 |
| 6,086,676 A | * | 7/2000 | Kao et al. ..................... | 118/695 |
| 6,149,500 A | * | 11/2000 | Takahashi et al. ............. | 451/41 |
| 6,184,970 B1 | * | 2/2001 | Nakahara et al. .............. | 355/47 |

* cited by examiner

Primary Examiner—Leo Picard
Assistant Examiner—Kidest Bahta
(74) Attorney, Agent, or Firm—Fitzpatrick, Cella, Harper & Scinto

(57) ABSTRACT

In a semiconductor exposure apparatus, when a trouble such as a wafer chuck error which requires operator's action in the chamber occurs, execution or interruption of the exposure sequence is determined on the basis of the situation of the exposure sequence, and unlock of the door of the chamber is controlled on the basis of the determination result. After the error is eliminated, lock of the door is controlled, and the exposure sequence is resumed. By eliminating human factors in operation and making the time required for restoration as short as possible, the interruption time of the semiconductor exposure apparatus is minimized to improve the operation efficiency of the manufacturing line.

19 Claims, 20 Drawing Sheets

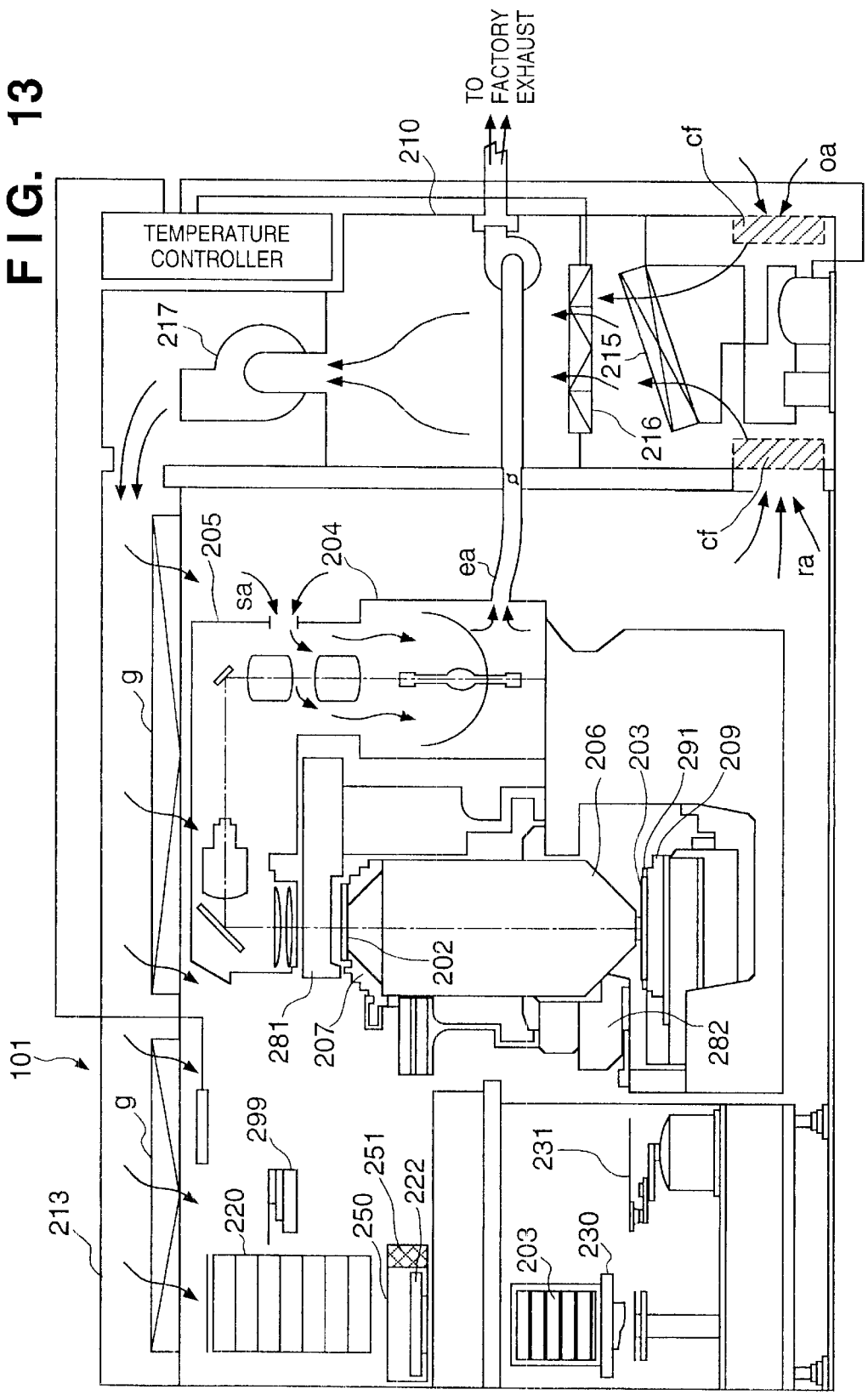

255

256

222

255

SEMICONDUCTOR EXPOSURE APPARATUS AND DEVICE MANUFACTURING METHOD USING THE SAME

BACKGROUND OF THE INVENTION

A semiconductor exposure apparatus for manufacturing a semiconductor device such as an LSI or a VLSI and a device manufacturing method using the same.

In a conventional laser process apparatus, e.g., a semiconductor exposure apparatus, the entire apparatus is covered with a chamber to allow temperature control of the apparatus and simultaneously ensure safety for operators of the apparatus and operators around the apparatus. Such a chamber of a laser process apparatus normally has a door through which an object such as a reticle to be exposed is loaded/unloaded into/from the apparatus. The laser is turned on only while the door is closed.

Normally, in such a semiconductor exposure apparatus, objects to be exposed are stored in a case capable of storing one or more objects to be exposed and loaded/unloaded into/from the apparatus. The semiconductor exposure apparatus incorporates a means for holding a plurality of cases, so not only a case that is currently being processed but also cases that are already processed or cases that are to be processed next can also be simultaneously held in the apparatus.

The semiconductor exposure apparatus has an interlock mechanism for protecting human bodies from being exposed to scattered light from a laser used as a light source or coming into contact with various manipulators.

The interlock is actuated instantaneously to interrupt laser oscillation and operation of manipulators when the work door of the chamber opens. Hence, when an operator carelessly opens the work door during a normal exposure sequence, the operation efficiency of the apparatus lowers. Interruption of laser operation adversely affects the quality of products.

When the operation of manipulators is interrupted, a long time is required to resume the exposure sequence. In the semiconductor exposure apparatus, to prevent such troubles, the lock of the work door is controlled in accordance with the state of the exposure sequence. The work door is originally provided on the chamber to load/unload wafer cassettes or reticle cassettes into/from the apparatus. Hence, the work door is controlled such that when no processing such as an exposure sequence is in progress, the work door is unlocked or the operator can easily unlock the work door, and when processing is in progress, the work door is locked.

In recent years, according to on-line or in-line automatization of a production system using an advanced semiconductor manufacturing apparatus, the operation efficiency of a semiconductor device manufacturing line is greatly increasing. In the manufacturing line, if troubles occur on the individual apparatuses, the entire production system stops. The frequency of various troubles that occur on the individual apparatuses and the time required for restoration largely influences the operation efficiency of the entire manufacturing line.

Under the circumstance, troubles due to human errors or malfunction of apparatuses are reduced by automation, improvement of apparatus performance, or improvement of maintenance technology. On the other hand, semiconductor exposure apparatuses have not taken sufficient measures against troubles on wafer conveyance due to wafer deformation in the semiconductor device manufacturing process.

A wafer chuck error during wafer conveyance is representative of troubles due to wafer deformation. If a wafer chuck error takes place, the operator must interrupt the operation of the semiconductor exposure apparatus and remove the wafer while keeping the work door of the chamber open.

However, in the conventional semiconductor exposure apparatus, even when a wafer chuck error occurs during the exposure sequence, it is determined that processing in the apparatus is continued, and the work door of the chamber is kept locked.

To eliminate the error while keeping the work door of the chamber open, the work door must be forcibly unlocked using a dedicated key switch. When the work door is unlocked in this way, the lock is controlled without intervention of the sequence controller. For this reason, when the exposure sequence is resumed, a human error such as door open may occur. Depending on the state of the exposure sequence, opening the work door may adversely affect the quality of products or prolong the time required for restoration. Hence, to unlock and release the work door of the chamber to remove errors of this type, the operator must check the exposure sequence or unlock the work door of the chamber. This prolongs the time required for restoration and consequently lowers the operation efficiency of the entire manufacturing line.

The operation efficiency lowers, not only due to restoration for wafer conveyance errors, but also when the apparatus normally operates as a single unit for loading (supplying) or unloading (delivering) a case storing objects to be exposed into or from the apparatus. If cases can be loaded/unloaded only while the laser is not lasing, processed cases may stay loaded in the apparatus long after exposure or cases may have to wait long before loaded and exposed. In this case, the number of cases in process becomes large in the entire manufacturing line, and the manufacturing lead time of semiconductor devices increases.

During loading/unloading, every time the door is opened, the interlock for invalidating laser operation is actuated to ensure sufficient safety against the laser beam and disables laser operation. Hence, processing of the apparatus itself is interrupted.

Canceling the interlock and enabling laser operation require manual operation unlike the normal control sequence. However, if an "error" occurs due to manual operation, the operation efficiency of the apparatus further lowers because restoration for removing this error is individually required. An example of a human error will be described. The operator must close the door and then depress the laser oscillation start button. If the door is closed, and laser operation is resumed without depressing the button, the apparatus determines that the laser oscillation start button is not depressed and detects an error. The operator is not aware that the button has not been depressed until an error is detected. For restoration after this error, elimination of the error using control software of the apparatus, restoration of the hardware of the apparatus to the home position, and the like are necessary, resulting in a decrease in operationed efficiency of the apparatus. When the apparatus is incorporated in an in-line system, such error lowers the efficiency of the entire line.

SUMMARY OF THE INVENTION

The present invention has been made in consideration of the above situation, and has as its object to minimize the time necessary for restoration after a trouble such as a wafer chuck error which requires operator's operation in the chamber of a semiconductor exposure apparatus so as to improve the operation efficiency of a manufacturing line as compared to the prior art.

It is another object of the present invention to allow to unload processed objects to be exposed (or cases storing the objects) or load objects to be exposed, which are to be processed, at an arbitrary time including the laser ON time and obviate the need for additional operations such as depressing a button every time objects to be exposed are loaded/unloaded into/from the apparatus, thereby preventing the operation efficiency of the apparatus from lowering due to loading/unloading the objects.

In order to achieve the above objects, according to the present invention, a semiconductor exposure apparatus and device manufacturing method using the exposure apparatus are characterized by the following arrangements.

There is provided a semiconductor exposure apparatus comprising determination means for determining a start or interruption of an exposure sequence, and control means for controlling to lock and unlock a door of a chamber of the semiconductor exposure apparatus in accordance with the determination result.

There is also provided a semiconductor exposure apparatus comprising means for determining whether or not an error generated during an exposure sequence can be eliminated by operation performed while keeping a door of a chamber of the semiconductor exposure apparatus open.

There is also provided a semiconductor exposure apparatus comprising means for detecting an error during a semiconductor exposure sequence, and means for determining the level of the detected error.

There is also provided a device manufacturing method using the exposure apparatus, comprising the steps of preparing the exposure apparatus, and performing exposure using the exposure apparatus.

There is also provided a semiconductor exposure apparatus comprising means for detecting an open/closed state of a door of a process chamber of the semiconductor exposure apparatus, means for controlling to lock the door on the basis of the detection result, and means for determining an interruption or resumption of a process in accordance with a locked/unlocked state of the door.

There is also provided a semiconductor exposure apparatus comprising scattered light limiting means for limiting the path where scattered light of a laser beam leaks from the apparatus in a plane or a space having a specific shape containing a path along which an object to be exposed or a case storing the object to be exposed moves, and loading/unloading means, engaging with the plane or space limited by the scattered light limiting means, for holding and moving the object to be exposed or the case while shielding the scattered light of the laser beam so as to load/unload the object to be exposed or the case between an internal space where the object to be exposed is irradiated with the laser beam and an external space.

There is also provided a device manufacturing method using the semiconductor exposure apparatus, comprising the steps of preparing the exposure apparatus, and performing exposure using the exposure apparatus.

According to a preferred aspect of the present invention, in the semiconductor exposure apparatus, the control means unlocks the door of the chamber when the exposure sequence is interrupted due to an error manufacturing.

According to a preferred aspect of the present invention, in the semiconductor exposure apparatus, the control means locks the door of the chamber when the interrupted exposure sequence is to be resumed.

According to a preferred aspect of the present invention, in the semiconductor exposure apparatus, the door of the chamber comprises a wafer cassette exchange door.

According to a preferred aspect of the present invention, in the semiconductor exposure apparatus, the door of the chamber comprises a reticle cassette exchange door.

According to a preferred aspect of the present invention, in the semiconductor exposure apparatus, unlock of the door of the semiconductor exposure apparatus is controlled on the basis of the determination result of the level of the detected error.

According to a preferred aspect of the present invention, in the semiconductor exposure apparatus, supply of a work to the semiconductor exposure apparatus is interrupted on the basis of the determination result of the level of the detected error.

According to a preferred aspect of the present invention, in the semiconductor exposure apparatus, the work comprises a wafer or a reticle.

According to a preferred aspect of the present invention, in the semiconductor exposure apparatus, when a work is being processed, the door is unlocked after processing of the work is ended.

According to a preferred aspect of the present invention, the semiconductor exposure apparatus further comprises unlock means for, on the basis of the determination result, interrupting the exposure sequence and then unlocking the door of the chamber of the semiconductor exposure apparatus, operation means for inputting an instruction for resuming the interrupted exposure sequence, and resumption means for locking the door and then resuming the exposure sequence.

According to a preferred aspect of the present invention, the semiconductor exposure apparatus further comprises notification means for notifying an operator that the door of the chamber of the semiconductor exposure apparatus is unlocked by the unlock means.

According to a preferred aspect of the present invention, in the semiconductor exposure apparatus, when an error is generated during wafer alignment or exposure processing, and the error does not adversely affect the processing, an interruption of the exposure sequence and unlock of the door by the unlock means are executed after exposure processing for all wafers is ended.

According to a preferred aspect of the present invention, a device manufacturing method using the exposure apparatus comprises the steps of preparing the exposure apparatus, and performing exposure using the exposure apparatus.

According to a preferred aspect of the present invention, in the semiconductor exposure apparatus, the object to be exposed comprises a reticle having a circuit pattern, and the object to be exposed is irradiated with the laser beam to transfer the circuit pattern to a photosensitive substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 13 is a view showing the internal structure of an apparatus according to the fourth embodiment of the present invention;

DETAILED DESCRIPTION OF THE PREFERRED EMBODIMENTS

Preferred embodiments of the present invention will be described in detail in accordance with the accompanying drawings.

First Embodiment

Figure 1:
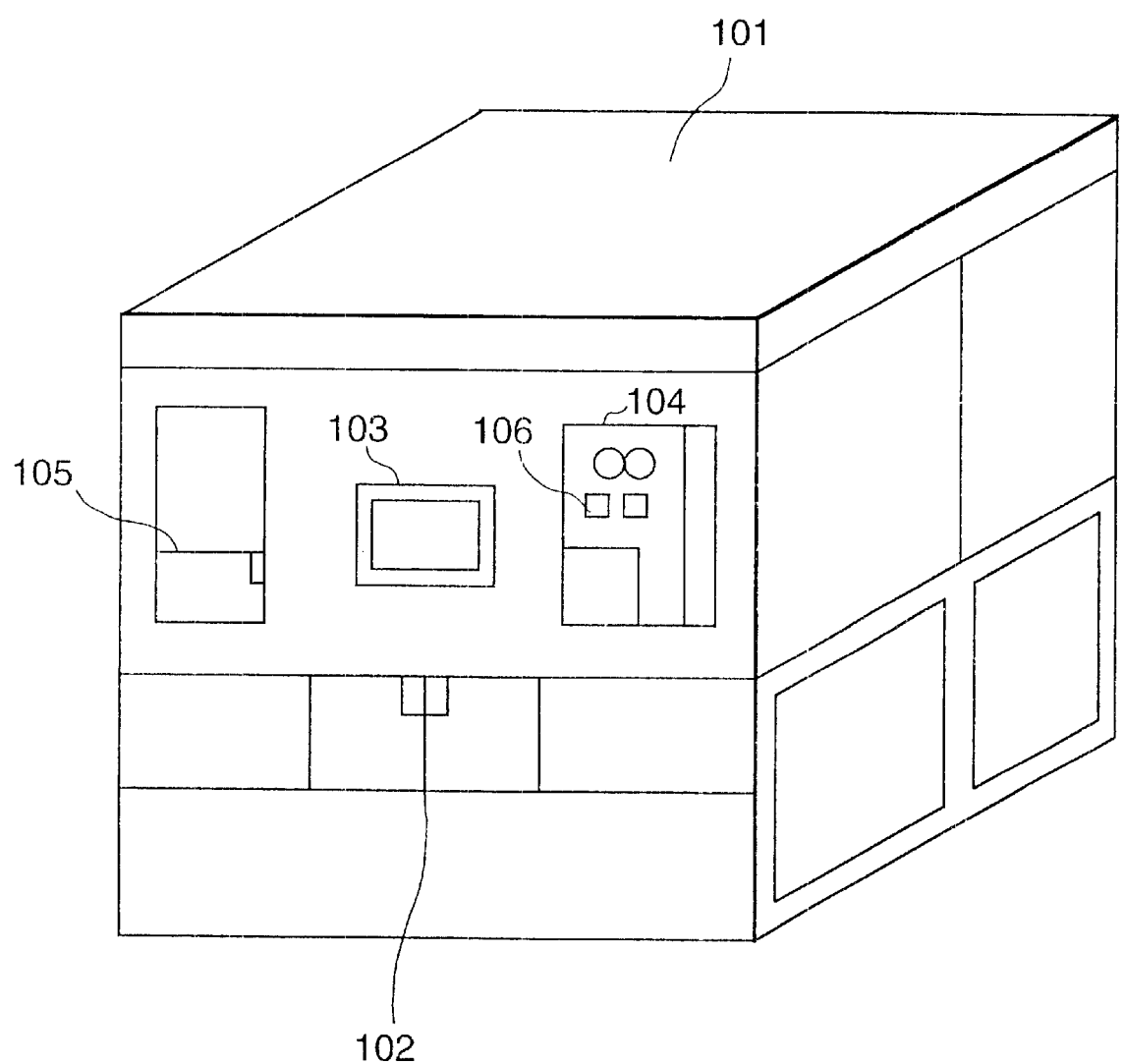
FIG. 1 perspective view showing the schematic appearance of a semiconductor exposure apparatus according to an embodiment of the present invention.

FIG. 1 is a perspective view of the chamber of a semiconductor exposure apparatus according to the first embodiment of the present invention. As shown in FIG. 1, a temperature control chamber 101 which covers the apparatus main body to control the environmental temperature of the apparatus main body has, on its front surface, a wafer cassette exchange door 102 used to load/unload a wafer cassette into/from the apparatus, a display 103 with touch panel, an operation panel 104, and a reticle cassette exchange opening. The reticle cassette exchange opening has a reticle cassette exchange door 105. The wafer cassette exchange door 102 and reticle cassette exchange door 105 have door locks which are controlled as needed. The operation panel 104 has a laser oscillation start button 106 for resuming interrupted laser oscillation.

Figure 2:
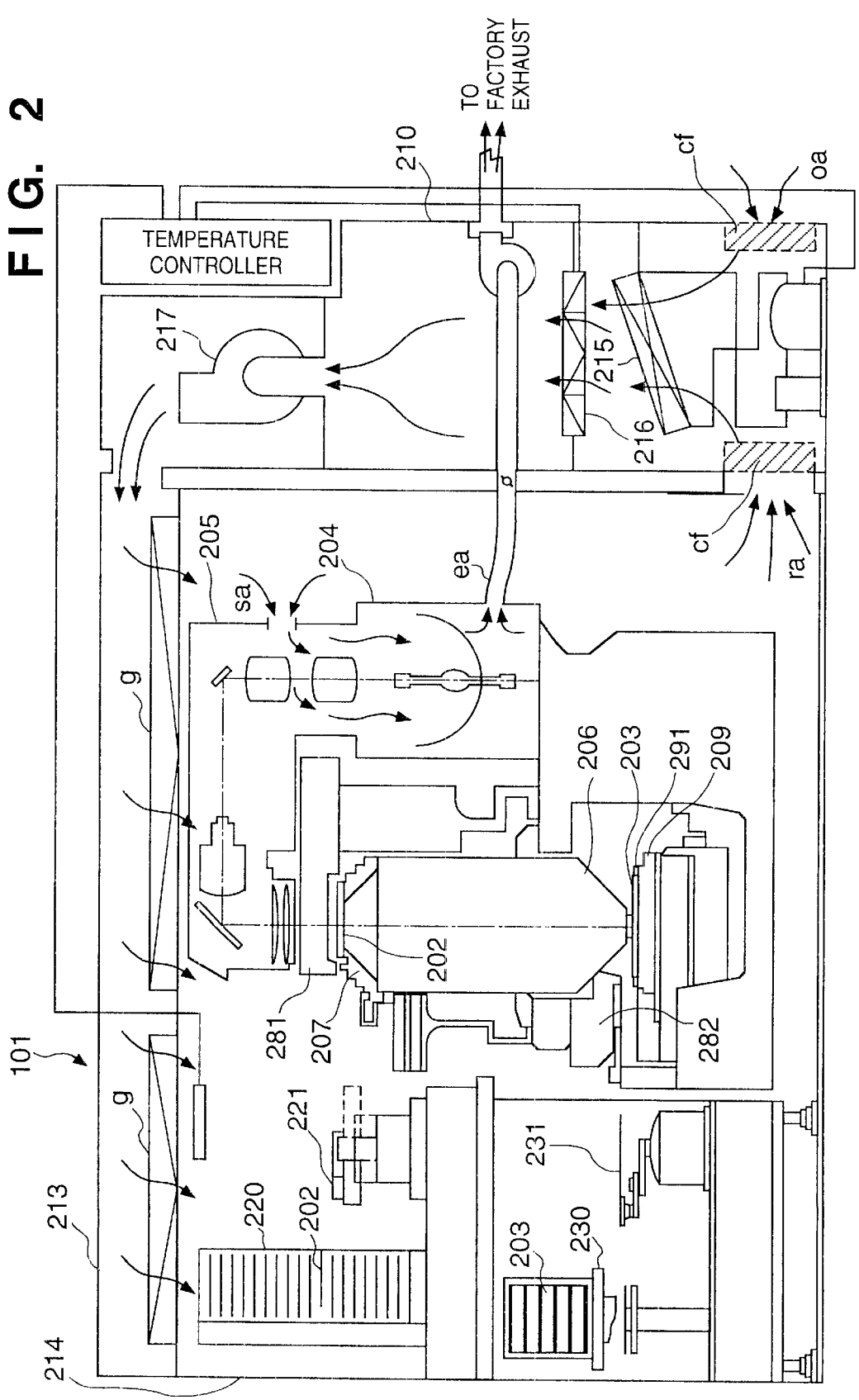
FIG. 2 is a view showing the internal structure of the apparatus shown in FIG. 1.

FIG. 2 is a view showing the internal structure of the apparatus shown in FIG. 1. FIG. 2 shows a stepper as a semiconductor exposure apparatus. Referring to FIG. 2, reference numeral 202 denotes a reticle, and 203, a wafer. When the reticle 202 is illuminated with a light beam from a light source unit 204 through an illumination optical system 205, the pattern on the reticle 202 can be transferred to the photosensitive layer on the wafer 203 through a projection optical lens 206. The reticle 202 is supported by a reticle stage 207. The wafer 203 is supported by a wafer chuck 291 and exposed. The wafer chuck 291 is fixed on a wafer stage 209 and is movable within the movable range of the wafer stage 209. A reticle optical system 281 mainly for detecting the misalignment amount of the reticle is disposed above the reticle 202. An off-axis microscope 282 is disposed above the wafer stage 209 to be adjacent to the projection optical lens 206.

The off-axis microscope 282 mainly detects the relative positions between reference marks on the apparatus and alignment marks on the wafer 203. A reticle conveyance unit comprised of a reticle library 220 and a reticle robot 221 and a wafer conveyance unit comprised of a wafer cassette elevator 230 and a wafer loading/unloading robot 231 are disposed adjacent to these main body units.

Figure 3:
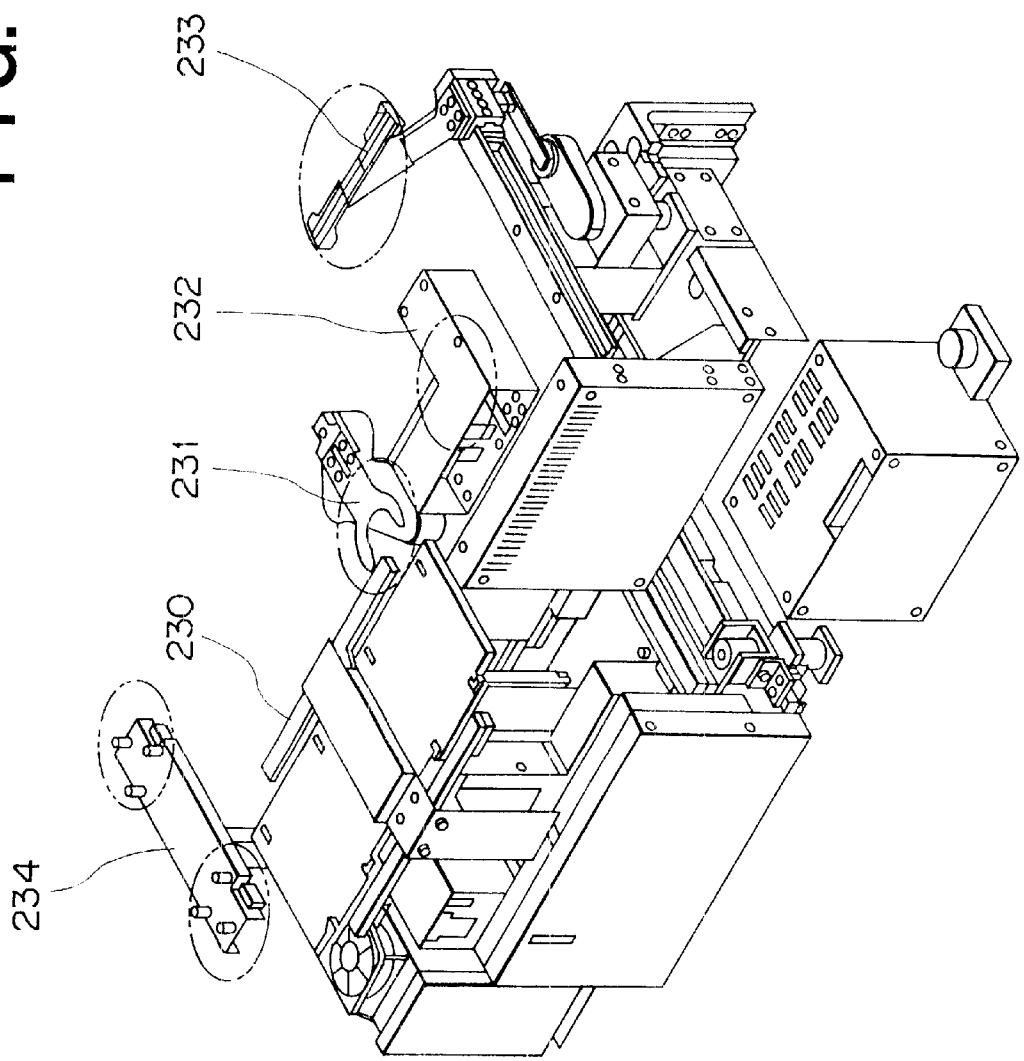
FIG. 3 is a perspective view showing a wafer conveyance unit incorporated in the apparatus shown in FIG. 1.

FIG. 3 is a perspective view of the wafer conveyance unit. Referring to FIG. 3, a prealignment unit 232 adjusts the position and direction of a wafer placed on the wafer chuck 291 using a prealignment stage rotatable and movable in the horizontal direction, an alignment light source, and an optical sensor. An in-line station 234 having two wafer holding sections and a signal input/output interface transfers a wafer to a coater/developer using synchronization via an interface. The wafer cassette elevator 230 individually drives two cassette tables in the vertical direction to allow the wafer loading/unloading robot 231 to load/unload a wafer into/from an arbitrary slot of a wafer cassette and also detects the presence/absence of wafers in the wafer cassette using a wafer sensor. The wafer loading/unloading robot 231 rotates, extends/retracts, moves vertically, or moves on a rail to transfer wafers among a wafer cassette on the wafer cassette elevator 230, prealignment unit 232, in-line station 234, and the wafer chuck 291 standing at the wafer recovery position. A wafer supply hand 233 conveys a wafer placed on the prealignment unit 232 to the wafer chuck 291 standing at the wafer supply position.

A sequence controller 402, a wafer conveyance controller 403, a wafer stage controller 404, and a reticle conveyance controller 405 parallelly process a plurality of sequences and synchronize sequences on a real-time operating system.

<Arrangement of Controller>

Figure 4:
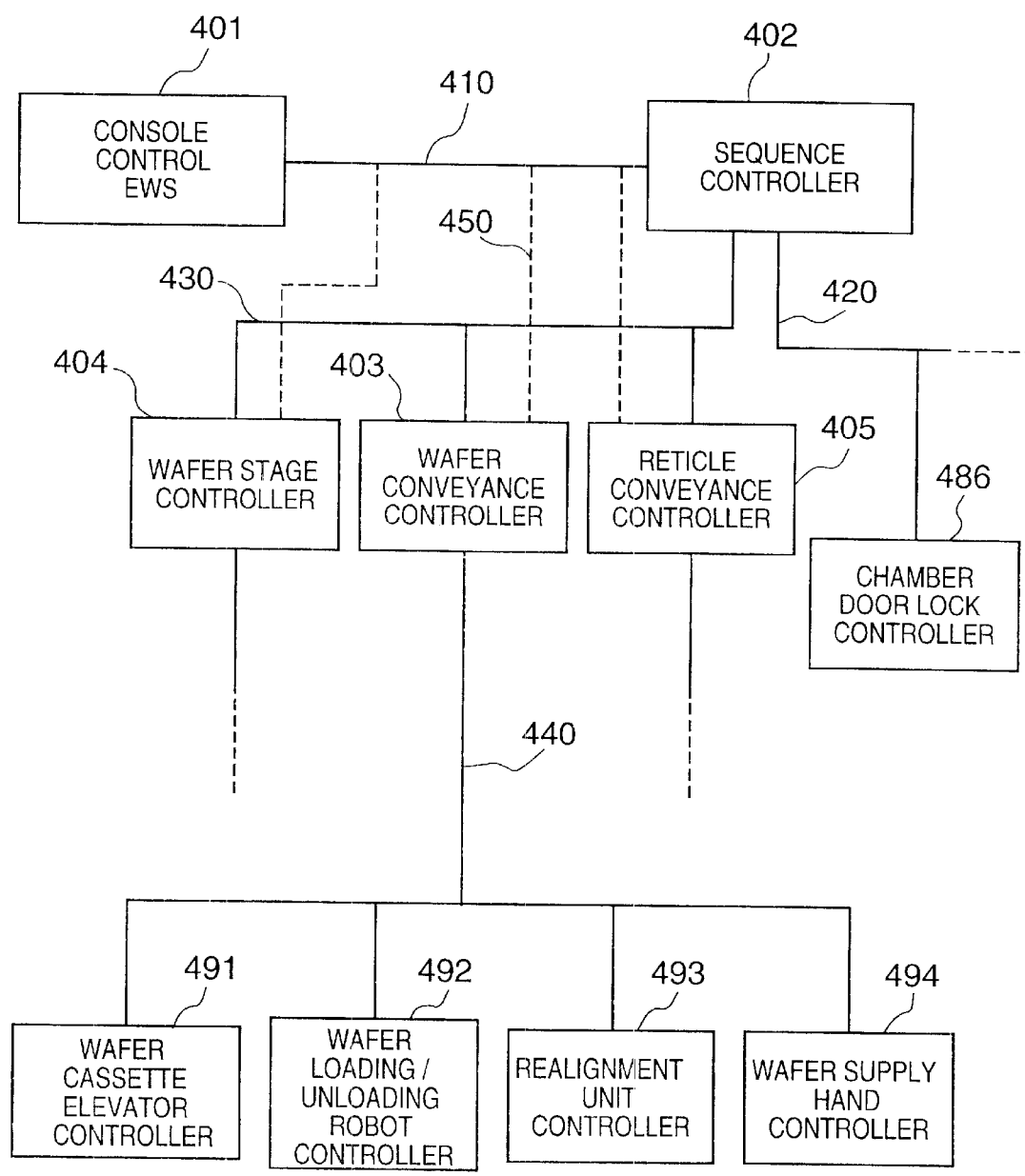
FIG. 4 is a block diagram showing a control mechanism of the apparatus shown in FIG. 1.

FIG. 4 shows the arrangement of a controller for controlling the semiconductor exposure apparatus. Referring to FIG. 4, a console control EWS 401 controls various operations or manages various system parameters and exposure control parameters through the display 103 with touch panel. The sequence controller 402 controls various subordinate controllers through communication means 420 and 430 while communicating with the console control EWS 401 to transmit/receive parameters or commands through a communication means 410, thereby managing the exposure sequence. The wafer conveyance controller 403 controls a wafer cassette elevator controller 491, a wafer loading/unloading robot controller 492, a prealignment controller 493, and a wafer supply hand controller 494 through a communication means 440, thereby managing wafer conveyance. The wafer stage controller 404 and reticle conveyance controller 405 also control a plurality of controllers, like the wafer conveyance controller 403, though they are not illustrated in FIG. 4. A chamber door lock controller 486 controls to lock/unlock the wafer cassette exchange door 102 and reticle cassette exchange door 105 and monitors the open/closed states of these doors. A number of controllers for controlling the alignment system unit, illumination optical system unit, and the like are also connected to the communication means 420, though they are not illustrated in FIG. 4. A communication means 450 is a logical communication means with which the wafer conveyance controller directly communicates with the console control EWS through the communication means 410 and 430.

<Exposure Sequence>

Figure 5A:
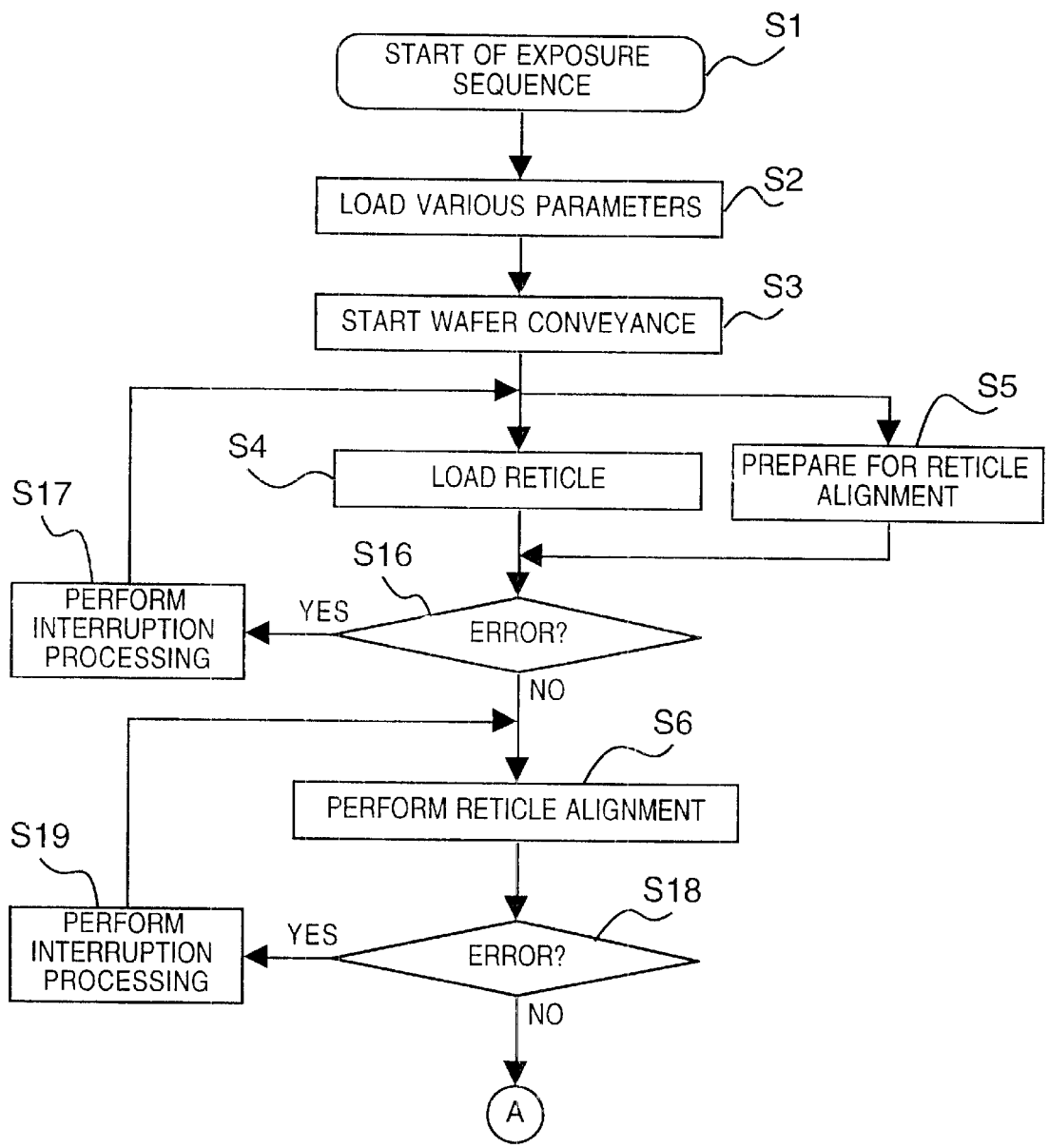
FIGS. 5A and 5B are flow charts showing an exposure procedure of the apparatus shown in FIG. 1.
Figure 5B:
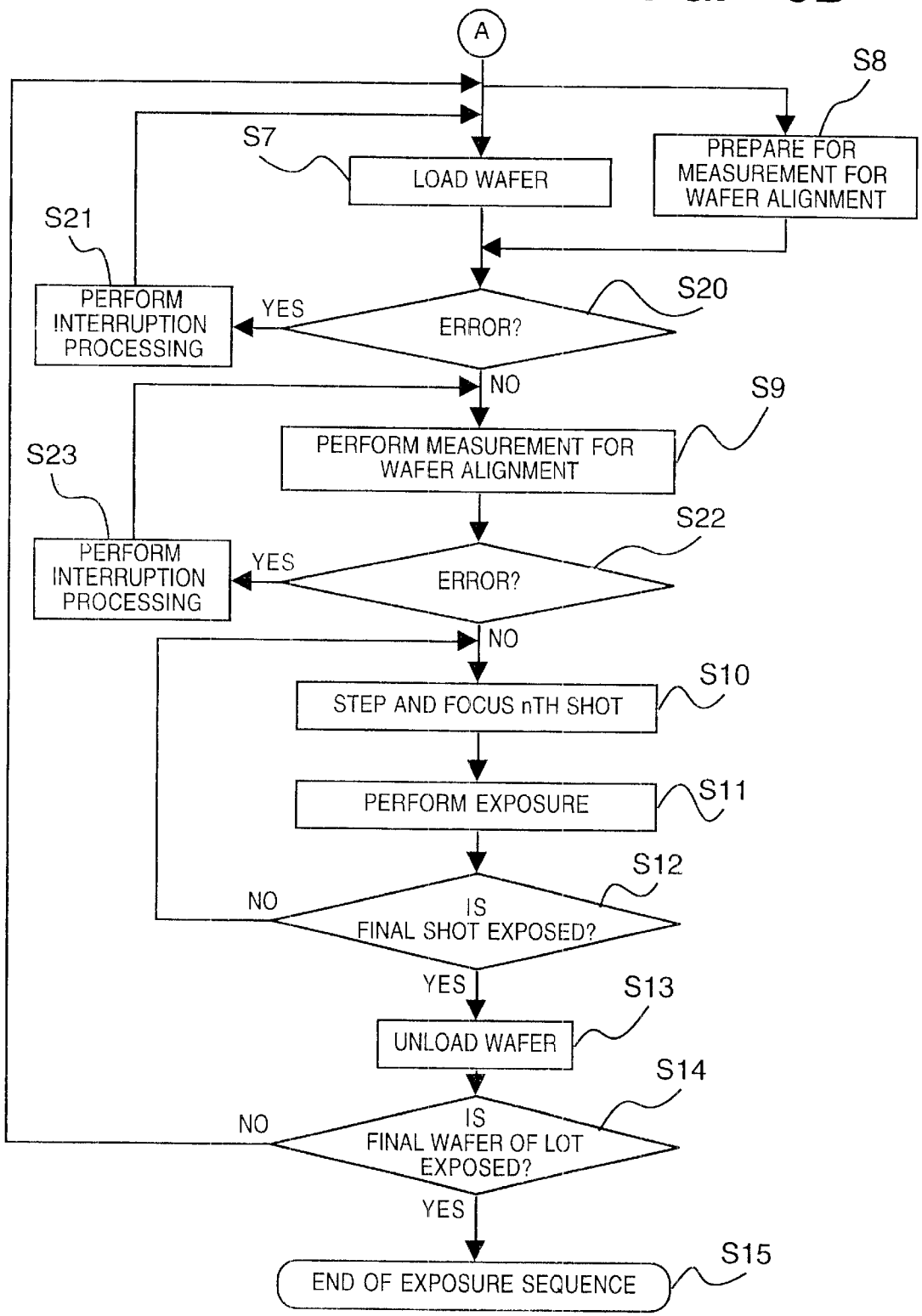

FIGS. 5A and 5B are flow charts showing the exposure sequence executed by the sequence controller 402. Upon receiving an exposure sequence execution command, the sequence controller 402 sets an exposure sequence execution flag, locks the wafer cassette exchange door 102, and then starts an exposure sequence (step S1). System parameters and exposure control parameters are received from the console control EWS 401 (step S2), and the wafer conveyance controller 403 is requested to start wafer conveyance (step S3). Next, while a reticle designated by an exposure control parameter is loaded onto the reticle stage (step S4), preparation for reticle alignment is done (step S5). When steps S4 and S5 are ended, the reticle alignment is performed (step S6). Next, while a wafer is supplied onto the wafer chuck 291 (step S7), preparation for measurement for wafer alignment is done (step S8). When steps S7 and S8 are ended, alignment marks on the wafer are measured for wafer alignment (step S9). After this, the wafer stage 209 is moved to the exposure position (step S10), and process for transferring a pattern on the reticle to the wafer is performed (step S1) until it is determined in step S12 that the final shot is exposed. After the exposed wafer is recovered from the wafer chuck 291 (step S13), it is determined whether or not the lot end condition as an exposure control parameter is satisfied (step S14).

If YES in step S14, the wafer cassette exchange door 102 is unlocked, the exposure sequence execution flag is cleared, and the exposure sequence ends (step S15).

If NO in step S14, the flow returns to steps S7 and S8 to prepare for measurement for wafer alignment while supplying the next wafer onto the wafer chuck 291. In step S3, the wafer conveyance system starts a pre-conveyance sequence for conveying wafers, as many as possible, prior to wafer placement on the wafer chuck 291 in step S7. This sequence is performed by the wafer conveyance controller 403 parallel to steps S7 and S8.

Errors in previous processing are determined (steps S16, S18, S20, and S22). If no errors has occurred (NO), the exposure sequence is continued. If an error is detected (YES), exposure sequence interruption processing is performed (steps S17, S19, S21, and S23). After this, the exposure sequence is resumed from the processing in which the error is detected.

Figure 6:
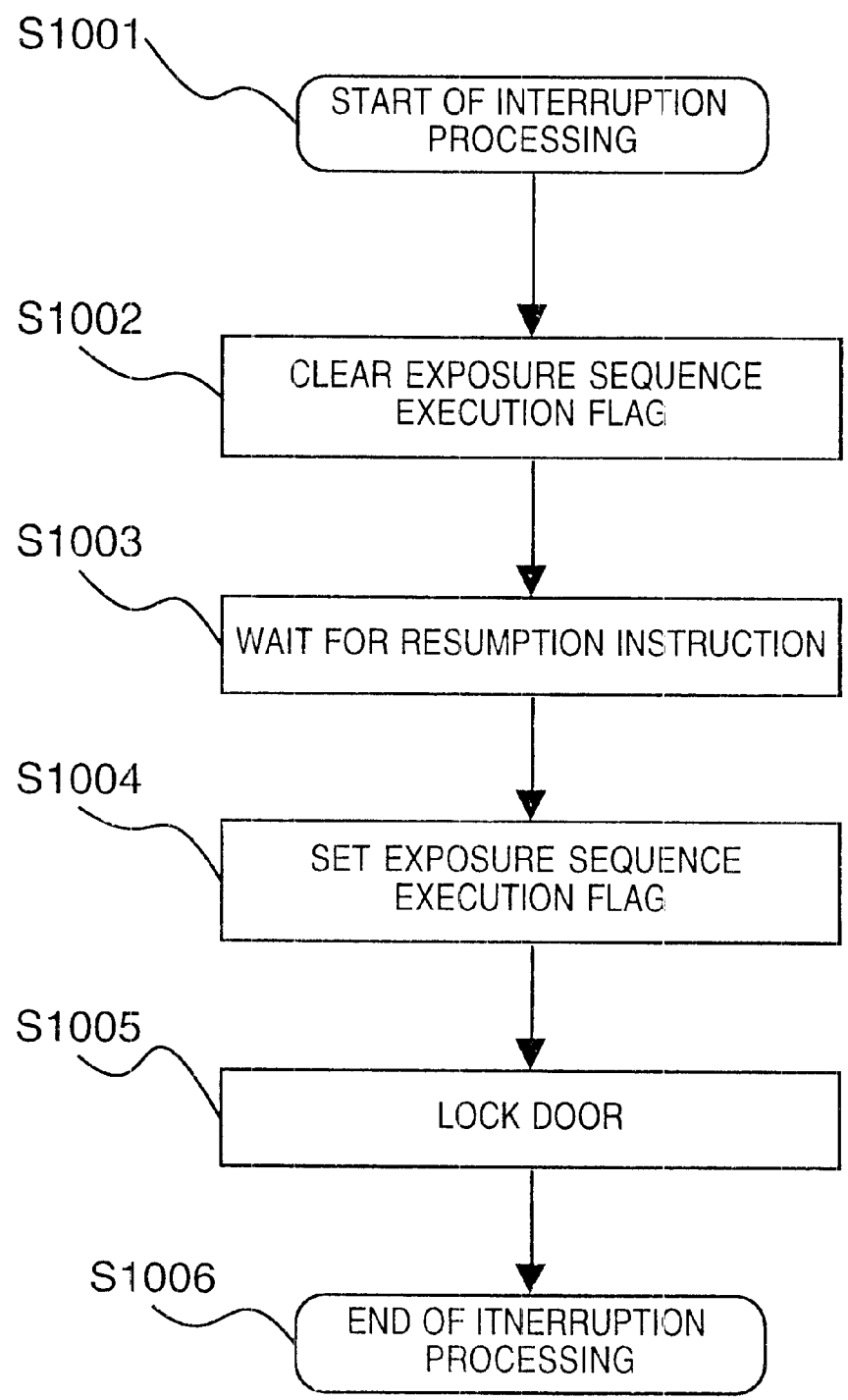
FIG. 6 is a flowchart showing interruption processing in FIGS. 5A and 5B.

FIG. 6 is a flow chart showing details of interruption processing in FIGS. 5A and 5B. Referring to FIG. 6, when interruption processing is started (step S1001), the exposure sequence execution flag is cleared (step S1002), and then, processing waits for a resumption instruction (step S1003). When a resumption instruction is received, the exposure sequence execution flag is set (step S1004), the wafer cassette exchange door and reticle cassette exchange door are locked (step S1005), and interruption processing is ended.

Figure 7:
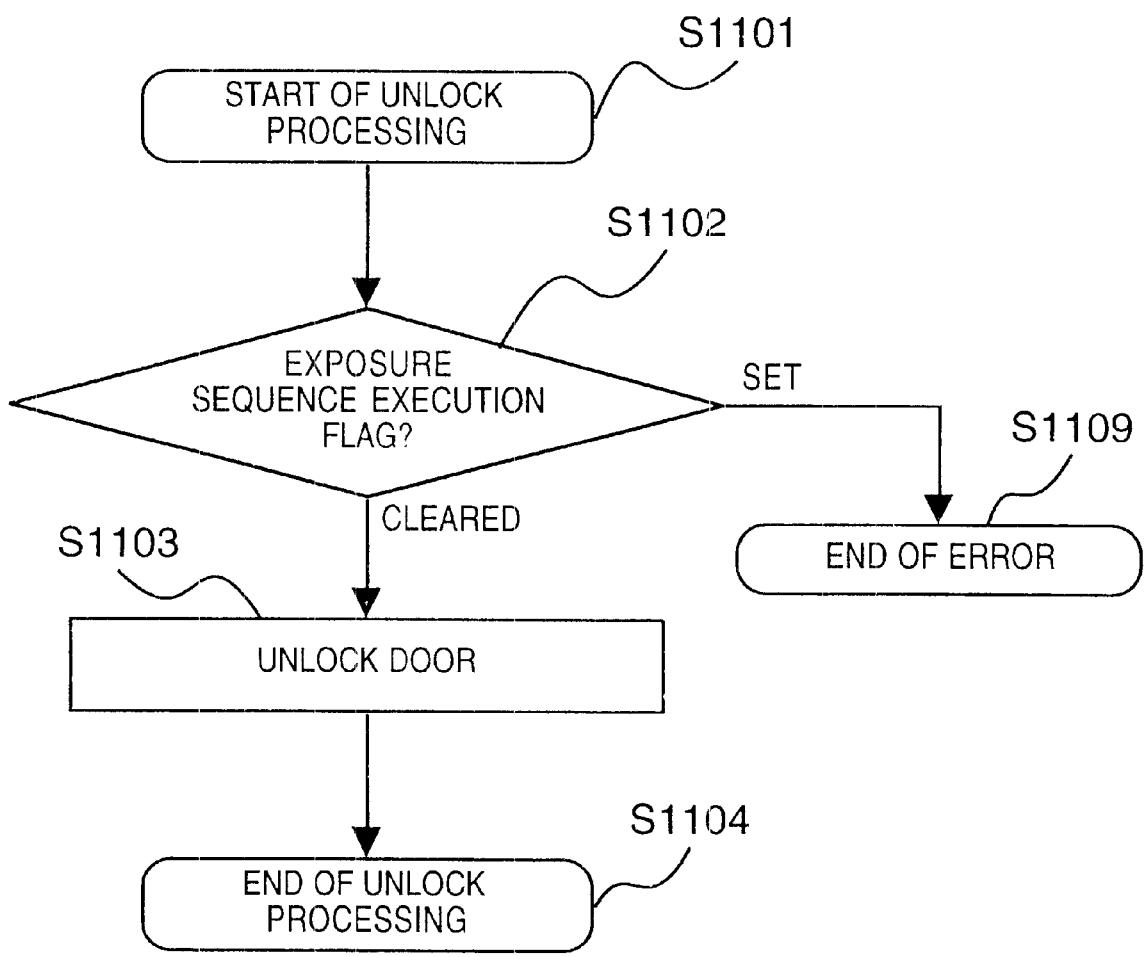
FIG. 7 is a flow chart showing unlock processing executed by a sequence controller.

FIG. 7 is a flow chart showing lock processing executed by the sequence controller when the operator depresses a wafer cassette exchange door (or reticle cassette exchange door) lock button on the display 103 with touch panel. When the sequence controller starts lock processing (step S1101), the state of the exposure sequence execution flag is determined (step S1102). When the flag is cleared, the wafer cassette exchange door (or reticle cassette exchange door) is unlocked, and lock processing is ended. If it is determined in step S1102 that the exposure sequence execution flag is set, lock processing ends as an error.

According to the first embodiment of the present invention, when the exposure sequence is interrupted due to an error during the exposure sequence, and the operator unlocks the wafer carrier exchange door (or reticle cassette exchange door) in the interrupted state, the door is automatically locked before the exposure sequence is resumed. For this reason, even when the operator forgets to lock the door before resumption, the exposure sequence can be continued after the door is properly locked.

Second Embodiment

Figure 8:
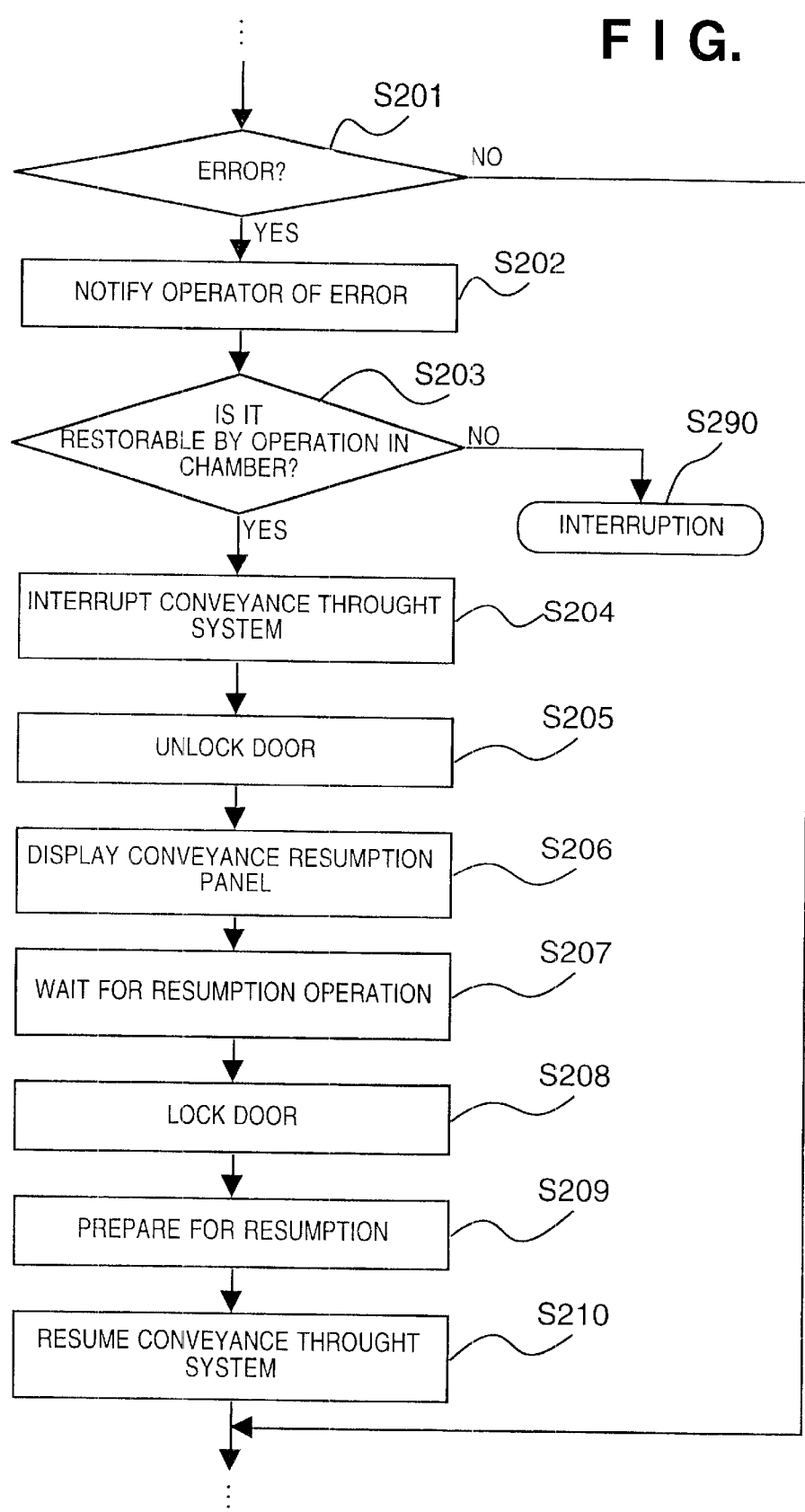
FIG. 8 is a flow chart showing an error processing procedure in the wafer conveyance sequence of the apparatus shown in FIG. 1.

FIG. 8 is a flow chart showing processing performed when a wafer conveyance controller 403 detects an error during wafer conveyance in the second embodiment having the same apparatus arrangement as that of the first embodiment of the present invention.

Referring to FIG. 8, in step S201, the presence/absence of an error in the previous processing is determined. In step S202, the contents of the error and information associated with measures are displayed on the display 103 with touch panel. In step S203, it is determined whether or not the error can be eliminated by operator's operation in the chamber.

In step S204, interruption processing for a conveyance sequence which is being parallelly executed is performed. In step S205, a request for unlocking the wafer cassette exchange door 102 is transmitted to the sequence controller 402, and an unlock completion notification is received. In step S206, the operator completes the operation in the chamber, and a conveyance resumption panel window is displayed on the display 103 with touch panel to resume wafer conveyance. In step S207, a conveyance resumption command issued upon depressing a button on the conveyance resumption panel window is waited for. In step S208, a request for locking the wafer cassette exchange door 102 is transmitted to the sequence controller 402, and a returned lock completion notification is received. In step S209, processing corresponding to the operator's operation in the chamber is performed to drive units or confirm states in accordance with the contents of the error. In step S210, the conveyance sequence interrupted in step S204 is resumed. Step S290 represents interruption of conveyance with an error.

According to the flow chart in FIG. 8, upon recognizing an error during conveyance (step S201), the wafer conveyance controller 403 displays the contents of the error and measures against the error on the display 103 with touch panel (step S202). When the error can be eliminated by operation in the chamber (YES in step S203), conveyance throughout the system is interrupted (step S204). After the sequence controller is requested to unlock the door, an unlock completion notification is waited for (step S205).

After the conveyance resumption panel is displayed (step S206), processing waits for the resumption operation by the operator (step S207). When the operator performs the resumption operation on the conveyance resumption panel, the wafer conveyance controller 403 recognizes it (step S207), requests the sequence controller to lock the door, and waits for a lock completion notification (step S208). After preparation for resumption (step S209), conveyance interrupted in step S204 is resumed (step S210) to continue the conveyance sequence.

Figure 9A:
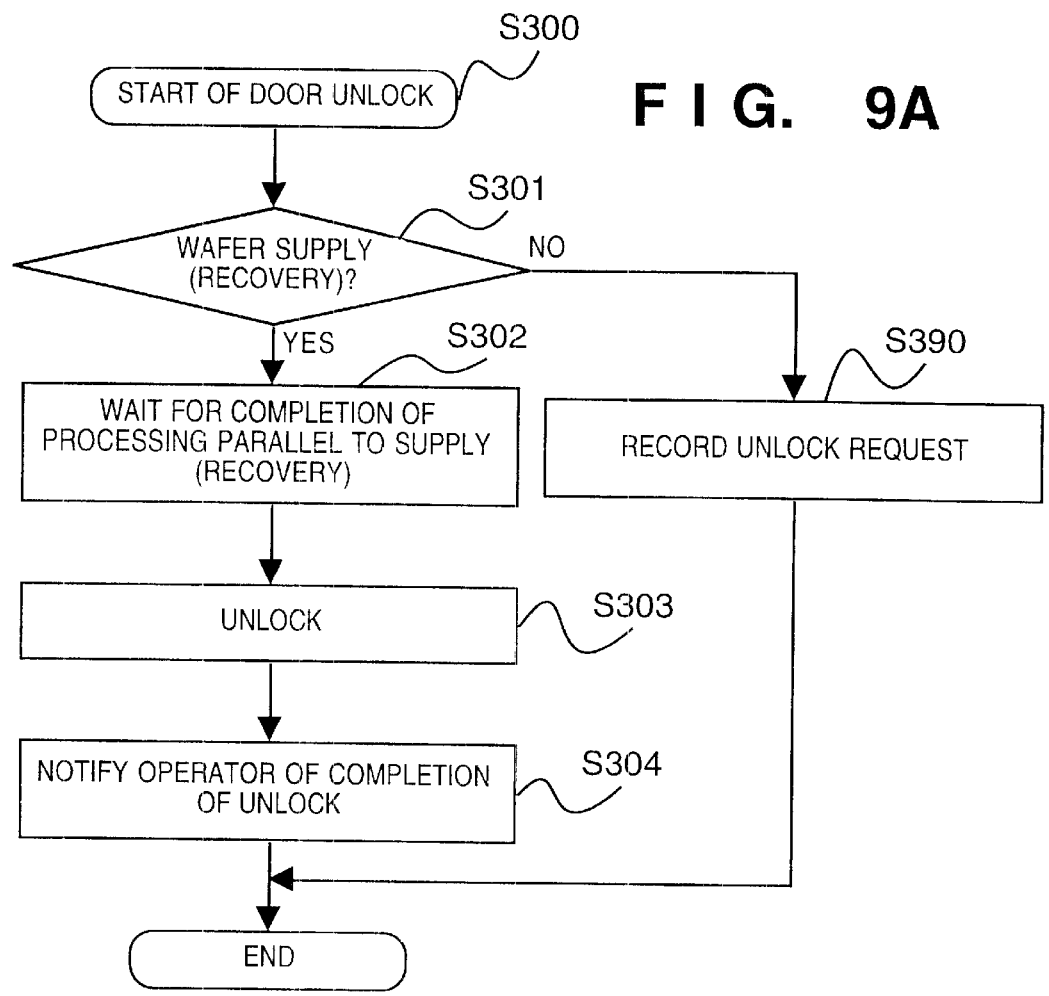
FIGS. 9A and 9B are flow charts showing an unlock/lock procedure executed when a conveyance error occurs in the apparatus shown in FIG. 1.
Figure 9B:
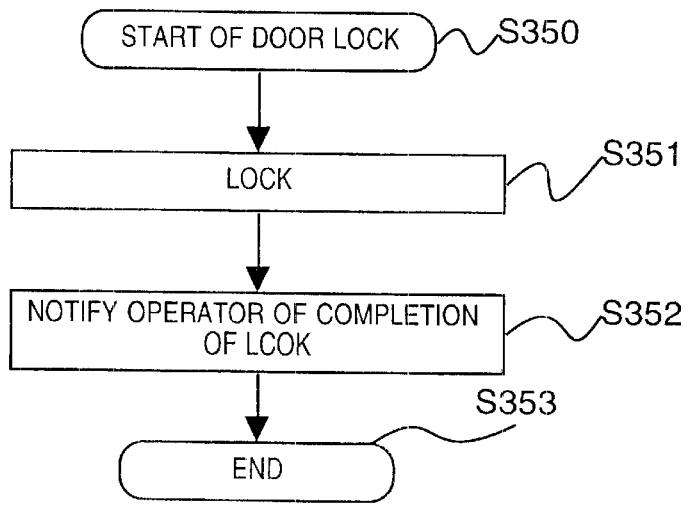

FIGS. 9A and 9B are flow charts showing details of processing executed by the sequence controller 402 in correspondence with steps S205 and S208 shown in FIG. 8, respectively.

In the door unlock sequence shown in FIG. 9A, when an unlock request is received in step S205 in FIG. 8, the unlock sequence is started (step S300). It is determined whether or not wafer load (unload) of the exposure sequence is being performed (step S301). If wafer load (unload) is being performed, and another processing is being performed parallel to wafer load (unload), unlock processing waits until the processing is ended (step S302). After this, a chamber door lock controller 486 is caused to unlock the wafer cassette exchange door 102, and the unlocked state is displayed on the display 103 with touch panel (step S303). Next, the wafer conveyance controller 403 is notified of completion of unlock (step S304), and the unlock sequence is ended (step S305). If it is determined in step S301 that wafer load (unload) is not being performed, the unlock request from the wafer conveyance controller 403 is recorded (step S390), and the unlock sequence ends (step S305).

In the door lock sequence in FIG. 9B, when a lock request transmitted from the wafer conveyance controller 403 is received in step S208 in FIG. 8, the lock sequence is started (step S350). After the chamber door lock controller 486 is caused to lock the wafer cassette exchange door 102, the wafer conveyance controller 403 is notified of completion of lock (step S352), and the lock sequence ends (step S353).

In the unlock sequence shown in FIG. 9A, when wafer load (unload) of the exposure sequence is not being executed, the unlock request is merely recorded. When wafer load (unload) is being performed, unlock processing waits for completion of the processing. When the unlock request recorded in step S390 is detected at the start of wafer load (step S7) or wafer unload (step S13), processing in steps S302 to S304 and unlock request erase processing are performed.

That is, in the flow charts in FIGS. 5A and 5B, even when wafer alignment and exposure are underway in steps S9 to S12, an error may occur during wafer conveyance (step S3). For an error generated under these circumstances, the exposure sequence is not immediately interrupted to unlock the door. This is because an interruption of exposure sequence with continuous exposure in which wafer stage movement and exposure are repeatedly performed may adversely affect the quality of products.

The sequence controller supplies/recovers wafers to/from the wafer chuck by transmitting a command to the wafer conveyance controller and receiving an execution result. Hence, when conveyance is interrupted by the wafer conveyance controller, the exposure sequence can be interrupted.

In the above embodiment, when the wafer conveyance controller 403 is replaced with the reticle conveyance controller, and the wafer cassette exchange door is replaced with the reticle cassette exchange door, measures can also be taken against an error during reticle conveyance, as in wafer conveyance.

According to the second embodiment of the present invention, even when the controller (wafer conveyance controller 403) for managing errors is different from the controller (sequence controller 402) for managing the wafer cassette exchange door 102, the wafer cassette exchange door 102 can be easily locked/unlocked upon occurrence of an error during wafer conveyance.

Third Embodiment

Figure 10:
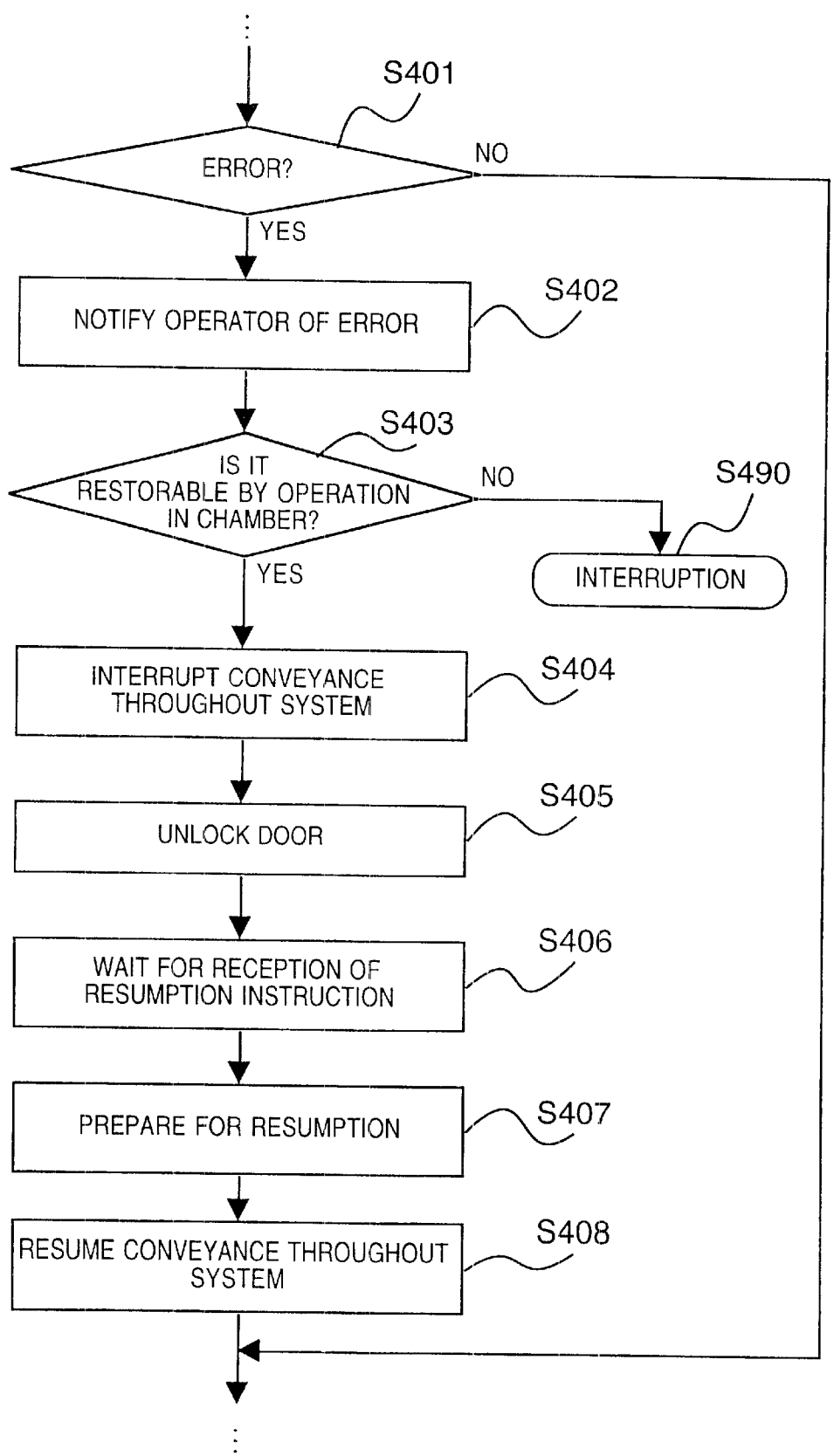
FIG. 10 is flow chart showing an error processing procedure in the wafer conveyance sequence in the third embodiment of the apparatus shown in FIG. 1.

FIG. 10 is a flow chart for explaining contents of processing by a wafer conveyance controller 403 for an error generated during wafer conveyance in the third embodiment having the same apparatus arrangement as that of the first embodiment of the present invention. Referring to FIG. 10, in step S401, the presence/absence of an error in the previous processing is determined. In step S402, the contents of the error and information associated with measures are displayed on a display 103 with touch panel.

In step S403, it is determined whether or not the error can be eliminated by operator's operation in the chamber. In step S404, the conveyance sequence which is being parallelly executed is interrupted. In step S405, a request for unlocking a wafer cassette exchange door 102 is transmitted to a sequence controller 402, and a returned unlock completion notification is received.

In step S406, a resumption instruction transmitted from the sequence controller 402 is received. In step S407, processing corresponding to the operator's operation in the chamber is performed to drive units or confirm states in accordance with the contents of the error. In step S408, the conveyance sequence interrupted in step S404 is resumed. In step S490, conveyance is interrupted when the error cannot be removed by operation in the chamber.

According to the flow chart in FIG. 10, upon recognizing an error during conveyance (step S401), the wafer conveyance controller 403 displays the contents of the error and measures against the error on the display 103 with touch panel (step S402). When the error can be eliminated by operation in the chamber (YES in step S403), conveyance throughout the system is interrupted (step S404). After the sequence controller 402 is requested to unlock the door, an unlock completion notification is waited for (step S405). Next, a resumption instruction from the sequence controller 402 is waited for (S406). When the resumption instruction is received, preparation for resumption is done (step S407). Conveyance interrupted in step S404 is resumed (step S408) to continue the conveyance sequence.

Figure 11:
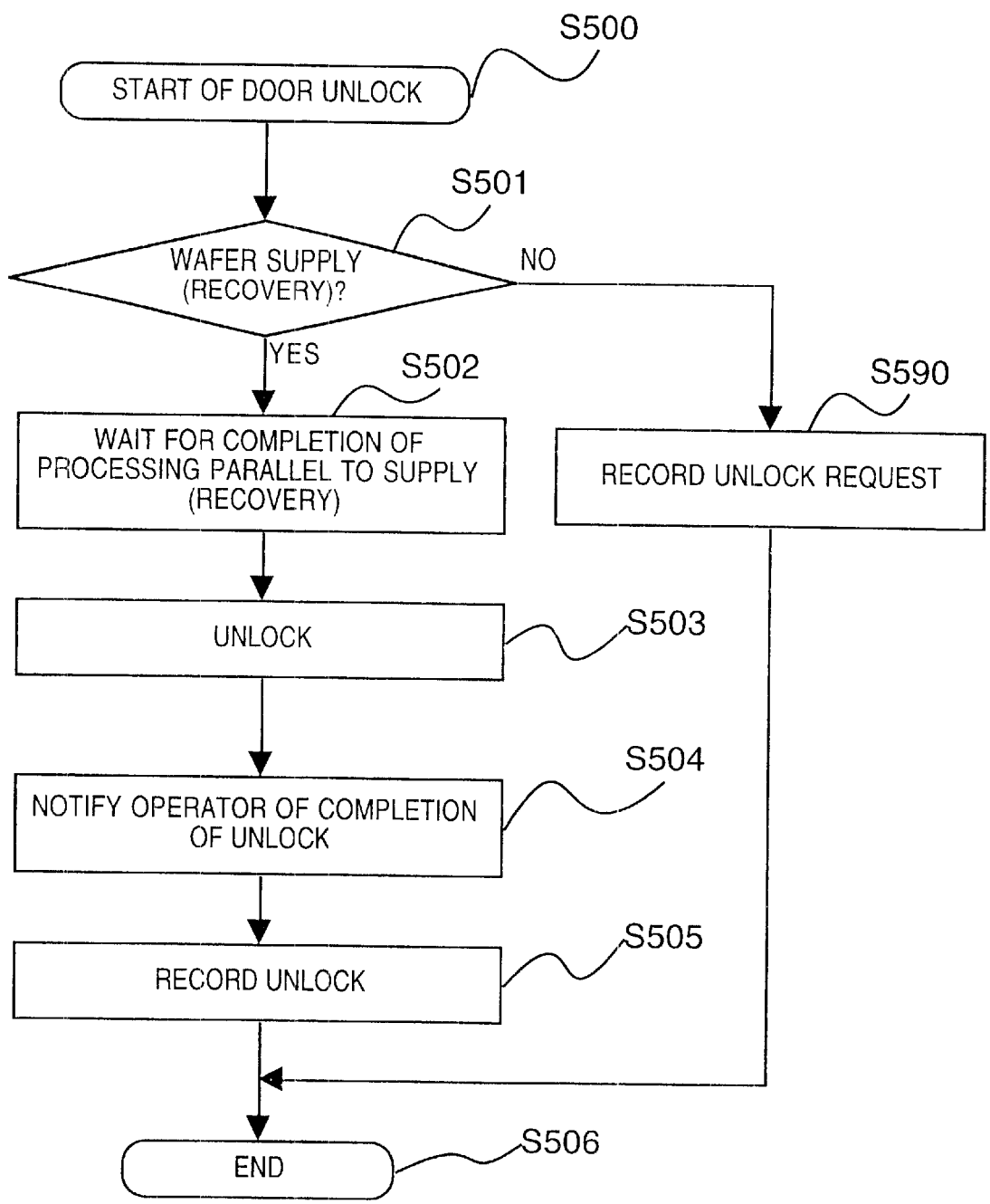
FIG. 11 is a flow chart showing an unlock procedure executed when a conveyance error occurs in the third embodiment.

FIG. 11 is a flow chart showing the unlock sequence executed by the sequence controller in correspondence with step S405 shown in FIG. 10. Referring to FIG. 11, upon receiving the unlock request transmitted in step S405, the wafer conveyance controller 403 starts an unlock sequence (step S500). It is determined whether or not wafer load (unload) of the exposure sequence is in progress (step S501). If wafer load (unload) is in progress, and another processing is also in progress parallel to wafer load (unload), unlock processing waits until the processing is ended (step S502). A chamber door lock controller 486 is caused to unlock the wafer cassette exchange door 102, and the unlocked state is displayed on the display 103 with touch panel (step S503). Next, the wafer conveyance controller 403 is notified of completion of unlock (step S504). After unlock based on the request from the wafer conveyance controller 403 is recorded (step S505), the unlock sequence is ended (step S506). If it is determined in step S501 that wafer load (unload) is not in progress, the unlock request from the wafer conveyance controller 403 is recorded (step S590), and the unlock sequence is ended (step S506). When the unlock request recorded in step S590 is detected at the start of wafer load (step S7) or wafer unload (step S13), processing in steps S502 to S505 and unlock request erase processing are performed. This processing is performed to prevent the exposure sequence from being interrupted during exposure of one wafer, as in the second embodiment.

In the third embodiment, completion of operator's operation in the chamber is recognized by closing the wafer cassette exchange door 102.

Figure 12:
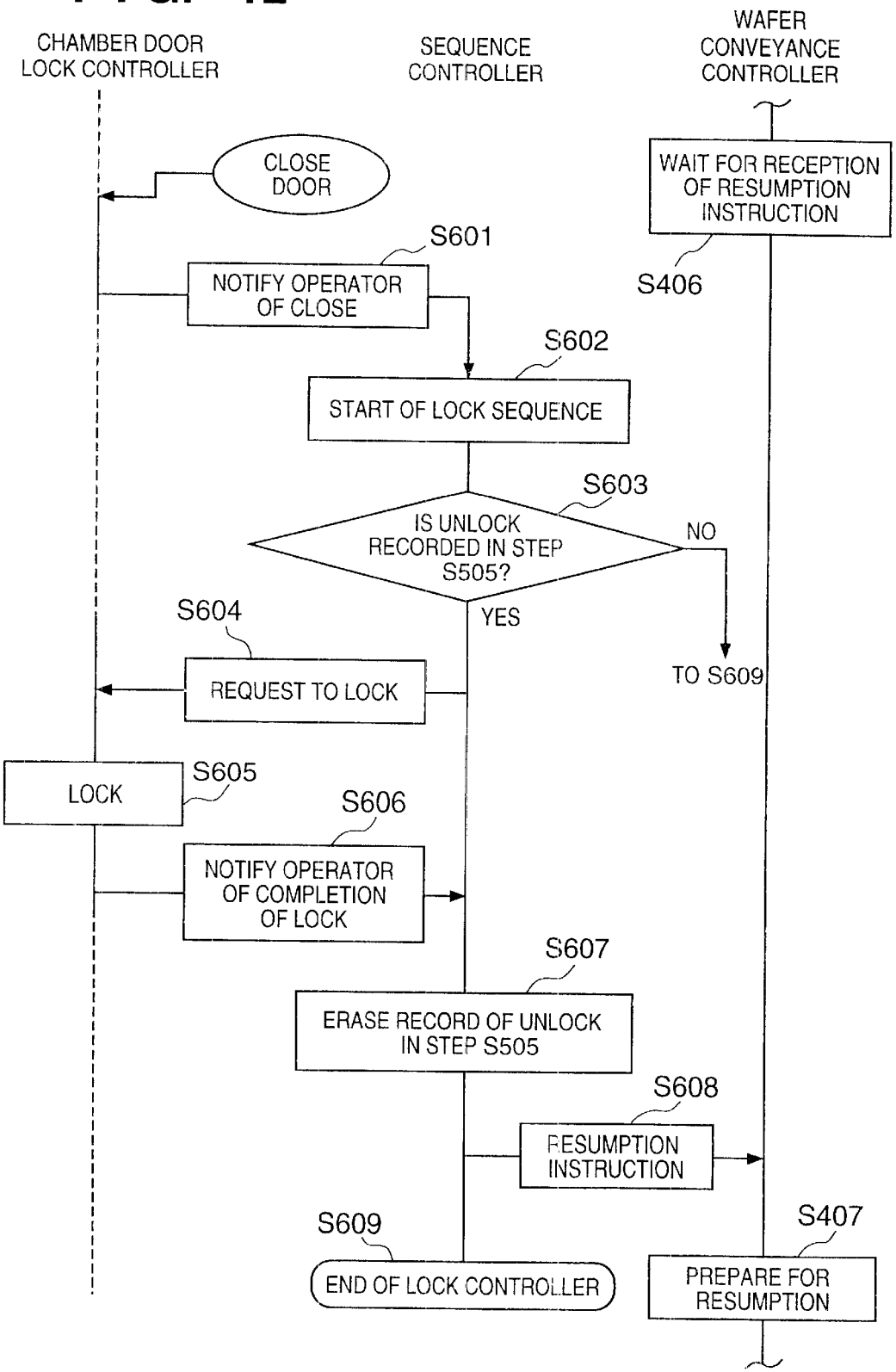
FIG. 12 is a flow chart showing the execution procedures of a chamber door lock controller, a sequence controller, and a wafer conveyance controller after a wafer cassette exchange door is closed in the third embodiment.

FIG. 12 is a flow chart showing processing and communication executed by the chamber door lock controller 486, sequence controller 402, and wafer conveyance controller 403 after the operator closes the wafer cassette exchange door 102. Referring to FIG. 12, steps S406 and S407 executed by the wafer conveyance controller match steps S406 and S407 shown in FIG. 10, respectively. Referring to FIG. 10, the operator closes the wafer cassette exchange door 102 which the wafer conveyance controller waits for a resumption instruction from the sequence controller 402 in step S406. The chamber door lock controller 486 detects it and notifies the sequence controller 402 that the door is closed (step S601). Upon receiving the notification, the sequence controller 402 starts the lock sequence (step S602) and determines whether or not unlock is recorded in step S505 (step S603). If unlock is recorded (YES in step S603), a lock request is transmitted to the chamber door lock controller 486 (step S604). Upon receiving the lock request, the chamber door lock controller 486 immediately locks the wafer cassette exchange door 102 and returns a lock completion notification to the sequence controller 402 (step S606). Upon receiving the lock completion notification, the sequence controller 402 erase the record of unlock (step S607) and transmits a resumption instruction to the wafer conveyance controller 403 (step S608), and the lock sequence ends (step S609). The wafer conveyance controller 403 receives the resumption instruction and immediately prepares for resumption (step S407). If it is determined in step S603 that unlock is not recorded (NO), the lock sequence ends immediately (S609). According to the third embodiment, additional operation for making the apparatus to recognize completion of operation can be omitted.

As described above, according to the present invention, a function of determining whether or not an error generated when the semiconductor exposure apparatus is executing the exposure sequence can be eliminated by operation with the chamber work door open is provided. With this arrangement, when trouble occurs in the semiconductor exposure apparatus, the time required for restoration against the trouble is minimized, and the operation efficiency of the manufacturing line can be improved.

When it is determined that the error generated during the exposure sequence can be eliminated by operator's operation in the chamber, the work door is automatically unlocked/locked, so the time required for restoration can be shortened.

Since the operator can recognize the unlocked state of the work door of the chamber, the operator can start restoration immediately after the door is unlocked.

The interruption of the exposure sequence and unlock of the work door due to an error are performed, if possible, after the wafer exposure processing ends. Hence, any adverse affect on the quality of products can be reduced.

Fourth Embodiment

The fourth embodiment of the present invention will be described below with reference to the accompanying drawings. The same reference numerals as in the above-described embodiments denote the same parts in the fourth embodiment, and a detailed description thereof will be omitted.

FIG. 13 is a perspective view showing the internal structure of a chamber shown in FIG. 1. FIG. 13 shows a stepper as a semiconductor exposure apparatus. Referring to FIG. 13, reference numeral 202 denotes a reticle, and 203, a wafer. When the reticle 202 is illuminated with a light beam from a light source unit 204 through an illumination optical system 205, the pattern on the reticle 202 can be transferred to the photosensitive layer on the wafer 203 through a projection optical lens 206. The reticle 202 is supported by a reticle stage 207. The wafer 203 is supported by a wafer chuck 291 and exposed. The wafer chuck 291 is fixed on a wafer stage 209 and is movable within the movable range of the wafer stage 209. A reticle optical system 281 for mainly detecting the misalignment amount of the reticle is disposed above the reticle 202. An off-axis microscope 282 is disposed above the wafer stage 209 to be adjacent to the projection optical lens 206.

The off-axis microscope 282 mainly detects the relative positions between reference marks on the apparatus and alignment marks on the wafer 203. A reticle conveyance unit comprised of a reticle library 220 and a reticle robot 299 and a wafer conveyance unit comprised of a wafer cassette elevator 230 and a wafer loading/unloading robot 231 are disposed adjacent to these main body units. A scattered light limiting means 250 and a loading/unloading means 251 engage with a reticle cassette exchange door portion (to be referred to as a "reticle exchange opening" hereinafter) 105 for exchanging a reticle cassette in a chamber 101. The loading/unloading means 251 loads/unloads a reticle case 222 between the external space and internal space of the apparatus.

Figure 14A:
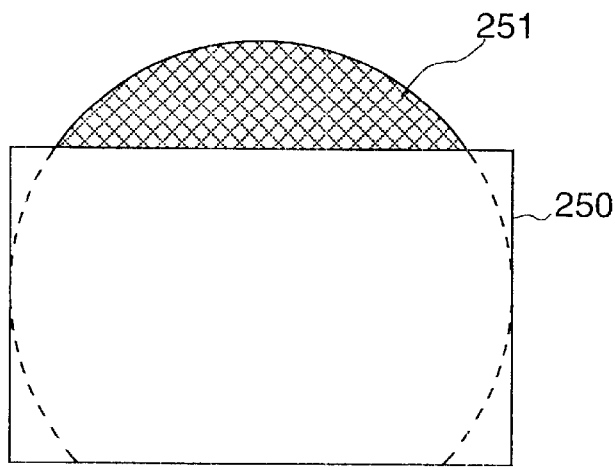
FIGS. 14A to 14E are views showing details of the fourth embodiment of the present invention.
Figure 14B:
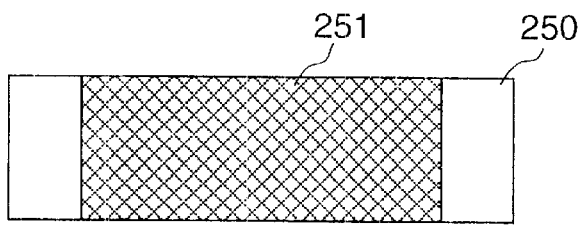
Figure 14C:
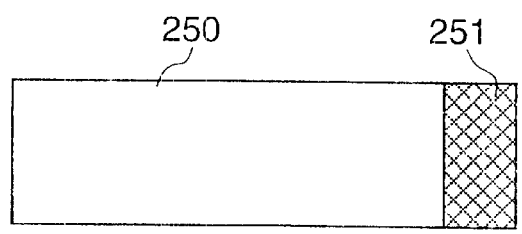
Figure 14D:
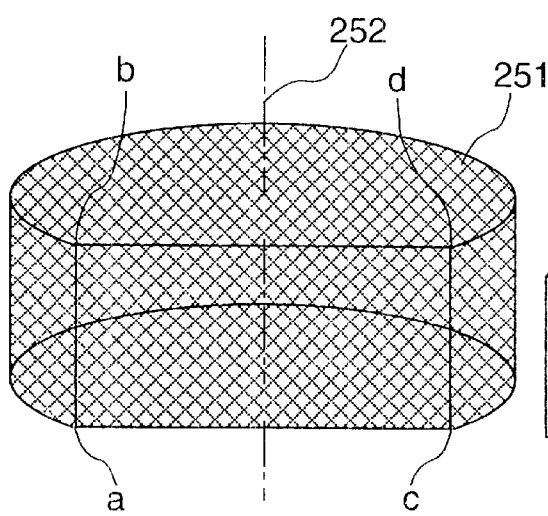
Figure 14E:
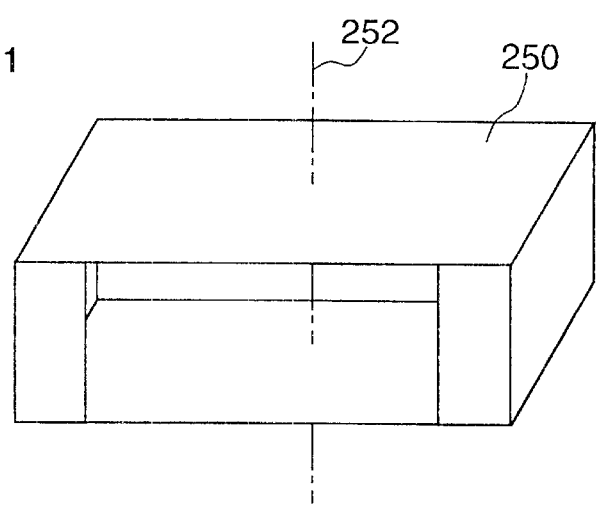

FIGS. 14A to 14E are views showing details of the scattered light limiting means 250 and loading/unloading means 251. FIGS. 14A, 14B, and 14C show the upper, front, and side surfaces of the scattered light limiting means 250 and loading/unloading means 251, respectively. FIGS. 14D and 14E are perspective views of the loading/unloading means 251 and scattered light limiting means 250 separated from each other. The angle of perspective view is changed between the scattered light limiting means 250 and loading/unloading means 251 for the illustrative convenience. Reference numeral 252 denotes a rotating shaft of the loading/unloading means 251. The scattered light limiting means 250 has openings at the same position in the front and rear surfaces. The loading/unloading means 251 has one opening (a, b, c, d in FIG. 14D) to store the reticle case 222. The loading/unloading means 251 can rotate about the rotating shaft 252 in the scattered light limiting means 250.

Figure 15A:
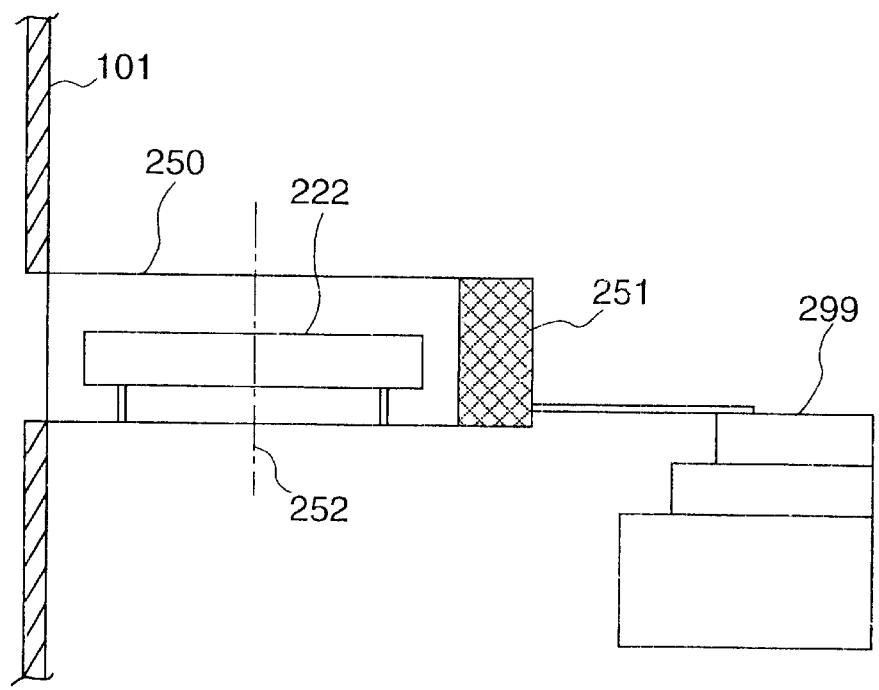
FIGS. 15A and 15B are views showing reticle case loading/unloading in the fourth embodiment of the present invention.
Figure 15B:
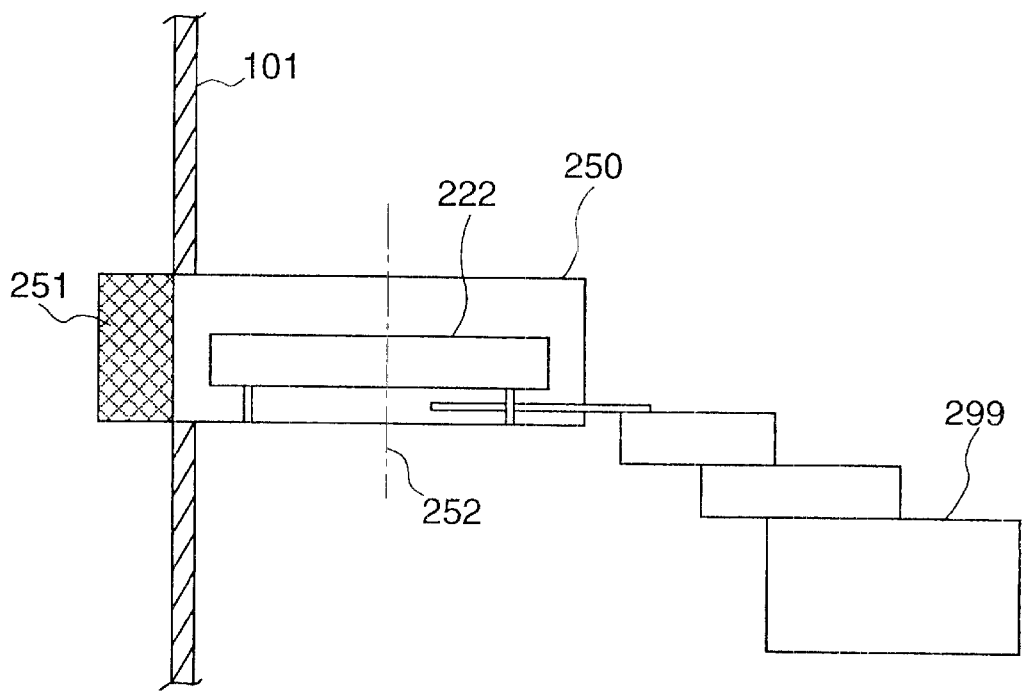

FIGS. 15A and 15B are views showing reticle case loading/unloading in the fourth embodiment. One opening of the scattered light limiting means 250 and the opening of the loading/unloading means 251 engage with the reticle cassette exchange opening 105 of the temperature control chamber 101. The loading/unloading means 251 rotates about the rotating shaft 252 in the scattered light limiting means 250. FIG. 15A shows a state wherein the opening of the loading/unloading means 251 is located on the temperature control chamber 101 side. In this state, the operator outside the temperature control chamber 101 can load/unload the reticle case 222 into/from the loading/unloading means 251. FIG. 15B shows a state wherein the opening of the loading/unloading means 251 is on the opposite side of the temperature control chamber 101. In this case, the reticle robot 299 can load/unload the reticle case 222 into/from the loading/unloading means 251. According to the fourth embodiment, works (e.g., reticle cases) used in the process can be loaded/unloaded through the loading/unloading means 251 without any cycle interruption of the semiconductor exposure apparatus.

Fifth Embodiment

The fifth embodiment of the present invention is related to a scattered light limiting means and a loading/unloading means, which are different from those of the fourth embodiment and capable of being arranged in a semiconductor exposure apparatus having the same arrangement as that of the fourth embodiment.

Figure 16A:
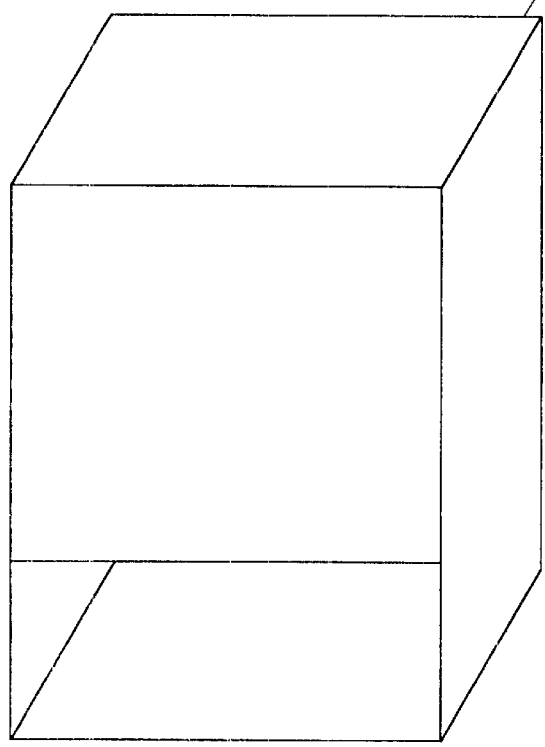
FIGS. 16A to 16C are views showing details of the fifth embodiment of the present invention.
Figure 16C:
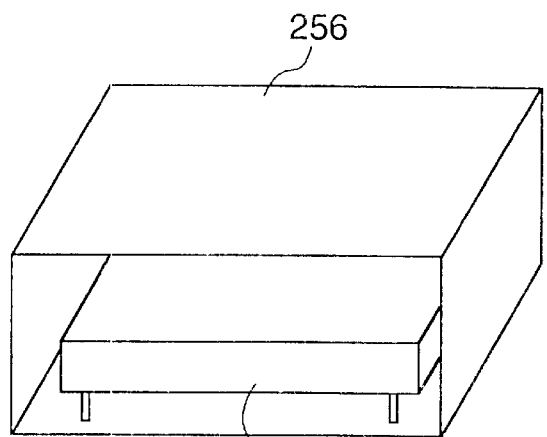
Figure 16B:
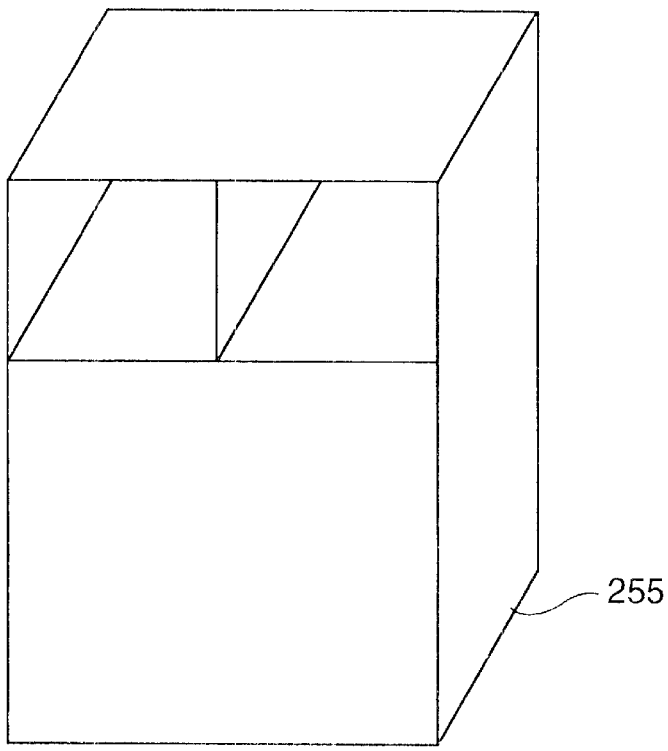

FIGS. 16A, 16B, and 16C are views showing details of a scattered light limiting means 255 and a loading/unloading means 256 of the fifth embodiment. The scattered light limiting means 255 whose perspective view is shown in FIG. 16A has an opening at a lower portion of the front surface. The scattered light limiting means 255 whose perspective view is shown in FIG. 16B has an opening at an upper portion of the rear surface. FIG. 16C shows the loading/unloading means 256 and a reticle case 222 placed in the loading/unloading means 256.

Figure 17A:
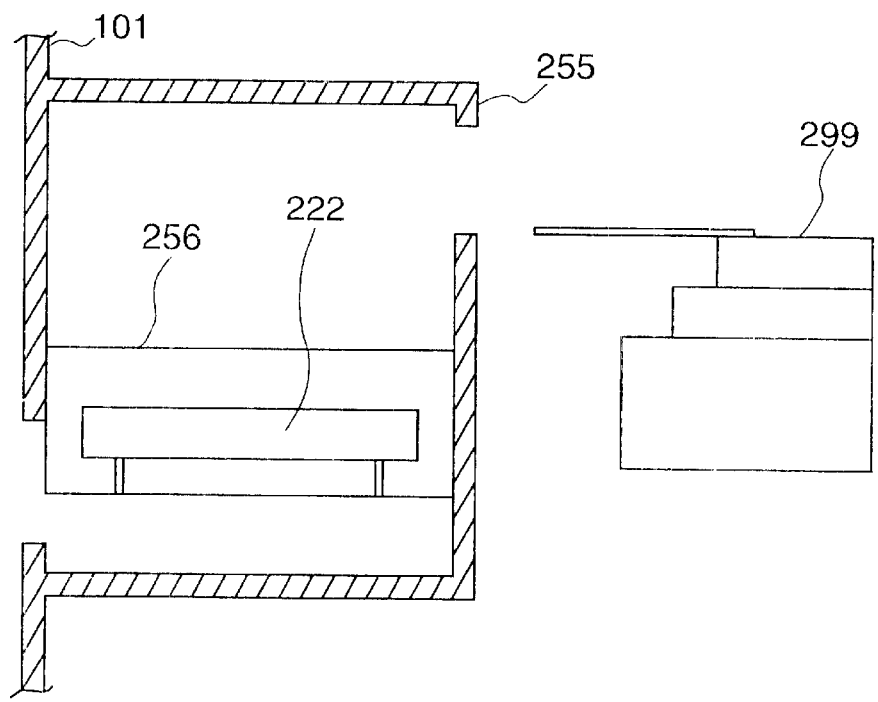
FIGS. 17A and 17B are views showing reticle case loading/unloading in the fifth embodiment of the present invention.
Figure 17B:
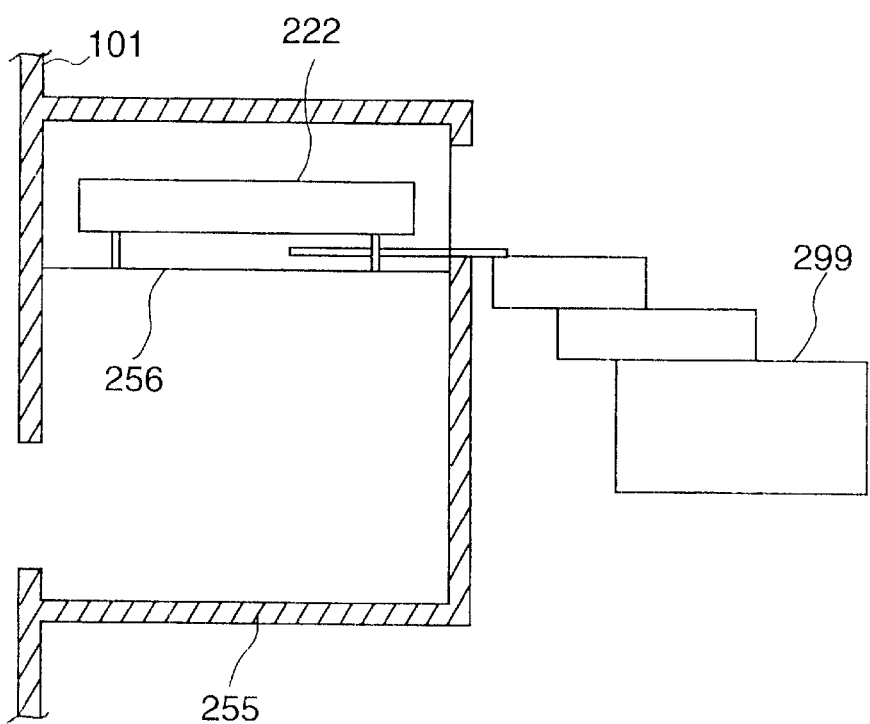

FIGS. 17A and 17B are views showing the reticle case loading/unloading forms of the fifth embodiment. Referring to FIGS. 17A and 17B, the opening at the lower portion of the front surface of the scattered light limiting means 255 engages with a reticle cassette exchange opening 105 (FIG. 1) of a temperature control chamber 101. The loading/unloading means 256 can move in the vertical direction in the scattered light limiting means 255.

FIG. 17A shows a state wherein the loading/unloading means 256 having the reticle case 222 moves in the scattered light limiting means 255. FIG. 17B shows a state wherein the loading/unloading means 256 having the reticle case 222 stands still at the uppermost end in the scattered light limiting means 255. When the loading/unloading means 256 stands still at the lowermost end in the scattered light limiting means 255, the operator outside the apparatus can load/unload the reticle case 222 into/from the loading/unloading means 256. When the loading/unloading means 256 stands still at the uppermost end in the scattered light limiting means 255, a reticle robot 299 can load/unload the reticle case 222 into/from the loading/unloading means 256. According to the fifth embodiment, works (e.g., reticle cases) used in the process can be loaded/unloaded through the loading/unloading means 256 without any cycle interruption of the semiconductor exposure apparatus.

Sixth Embodiment

As the sixth embodiment, a device production method using the above-described semiconductor exposure apparatus will be described.

Figure 18:
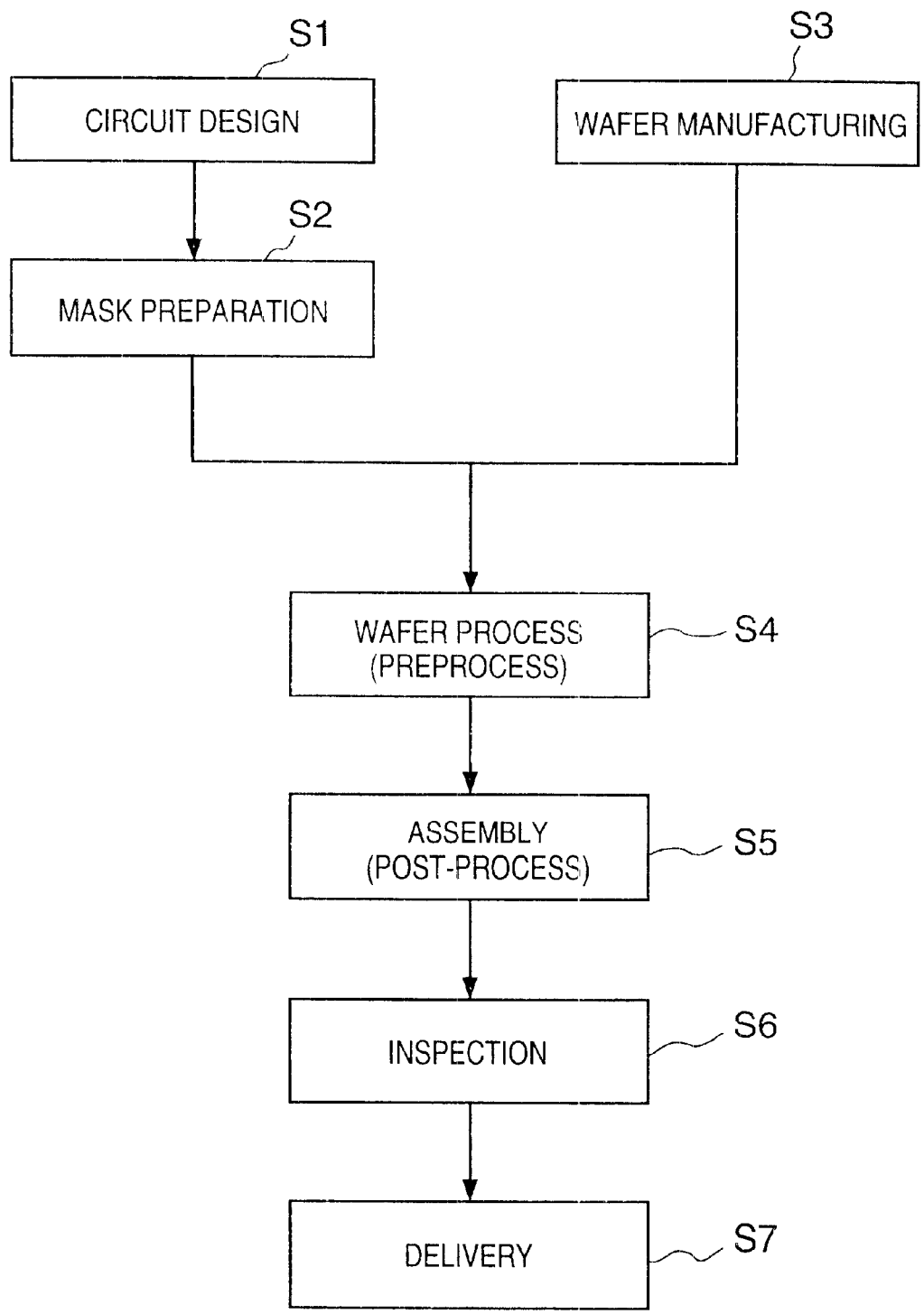
FIG. 18 is a flow chart of a semiconductor device manufacturing process.

FIG. 18 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacturing), a wafer is manufactured using a material such as silicon or glass. In step 4 (wafer process) called a preprocess, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and delivered (step 7).

Figure 19:
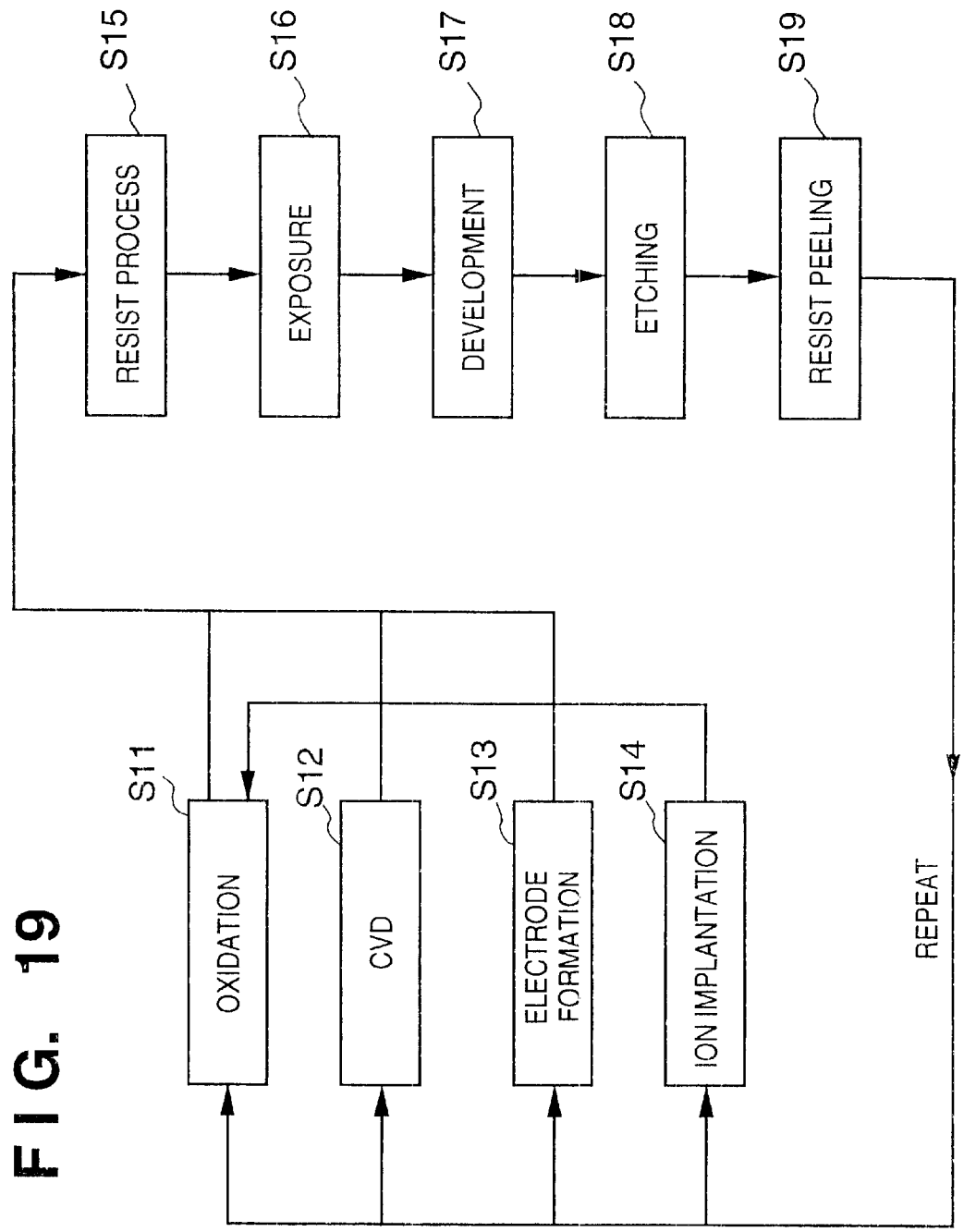
FIG. 19 is a flow chart of a wafer process.

FIG. 19 shows details of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is printed on the wafer by exposure using the above-described exposure apparatus. In step 17 (development), the exposed wafer is developed. In step 18 (etching), portions other than the developed resist image are etched. In step 19 (resist peeling), the resist unnecessary after etching is removed. By repeating these steps, a multilayered structure of circuit patterns is formed on the wafer.

When the production method of this embodiment is used, the throughput in the manufacture of a device with high degree of integration, which is conventionally difficult to manufacture, can be improved, and a device can be manufactured at low cost.

The present invention is riot limited to the above embodiments and various changes and modifications can be made within the spirit and scope of the present invention. Therefore, to appraise the public of the scope of the present invention, the following claims are made.

What is claimed is:

1. A semiconductor exposure apparatus comprising:
   determination means for determining a start or interruption of an exposure sequence based on: receiving an exposure sequence execution command, an end of the exposure sequence, detecting an error during the exposure sequence, and an operator's operation; and
   control means for controlling locking and unlocking of a door of a chamber of said semiconductor exposure apparatus in accordance with a determination result of said determination means.

2. The apparatus according to claim 1, wherein said control means unlocks the door of the chamber when the exposure sequence is interrupted due to an error.

3. The apparatus according to claim 1, wherein said control means locks the door of the chamber when the interrupted exposure sequence is to be resumed.

4. The apparatus according to claim 1, wherein the door of the chamber comprises a wafer cassette exchange door.

5. The apparatus according to claim 1, wherein the door of the chamber comprises a reticle cassette exchange door.

6. A semiconductor exposure apparatus comprising:
   means for receiving information for an exposure sequence based on: the exposure sequence execution command, an end of the exposure sequence, detecting an error during the exposure sequence, and an operator's operation;
   means for discriminating the error information based on the received information;

means for determining whether or not the error generated during the exposure sequence can be eliminated by an operation performed while a door of a chamber of said semiconductor exposure apparatus remains open, in accordance with the discriminated result; and control means for controlling locking and unlocking of the door of the chamber of said semiconductor exposure apparatus in accordance with the determination result.

7. A semiconductor exposure apparatus comprising:

means for receiving information for an exposure sequence based on: an exposure sequence execution command, an end of the exposure sequence, detecting an error during the exposure sequence, and an operator's operation;

means for determining a level of the detected error; and control means for controlling a start or interruption of the exposure sequence in accordance with received information and/or determination result of the level of the detected error.

8. The apparatus according to claim 7, wherein unlock of the door of said semiconductor exposure apparatus is controlled on the basis of the determination result of the level of the detected error.

9. The apparatus according to claim 7, wherein supply of a work to said semiconductor exposure apparatus is interrupted on the basis of the determination result of the level of the detected error.

10. The apparatus according to claim 9, wherein the work comprises a wafer or a reticle.

11. The apparatus according to claim 8, wherein when a work is being processed, the door is unlocked after processing of the work ends.

12. The apparatus according to claim 11, wherein the work comprises a wafer or a reticle.

13. The apparatus according to claim 6, further comprising unlock means for, on the basis of the determination result, interrupting the exposure sequence and then unlocking the door of the chamber of said semiconductor exposure apparatus, operation means for inputting an instruction for resuming the interrupted exposure sequence, and resumption means for locking the door and then resuming the exposure sequence.

14. The apparatus according to claim 13, further comprising notification means for notifying an operator that the door of the chamber of said semiconductor exposure apparatus is unlocked by said unlock means.

15. The apparatus according to claim 13, wherein when the error is generated during wafer alignment or exposure processing, and the error does not adversely affect the processing, the interruption of the exposure sequence and unlock of the door by said unlock means are executed after exposure processing for all wafers is ended.

16. A device manufacturing method using said exposure apparatus of claim 1, comprising the steps of:

preparing said exposure apparatus of claim 1; and performing exposure using said exposure apparatus.

17. A semiconductor exposure apparatus comprising:

means for detecting an open/closed state of a door of a process chamber of said semiconductor exposure apparatus;

means for controlling to lock the door of the process chamber on the basis of the detection result; and means for determining an interruption or resumption of a process in accordance with a locked/unlocked state of the door.

18. The apparatus according to claim 17, wherein the object to be exposed comprises a reticle having a circuit pattern, and the object to be exposed is irradiated with the laser beam to transfer the circuit pattern to a photosensitive substrate.

19. A device manufacturing method using said semiconductor exposure apparatus of claim 17, comprising the steps of:

preparing said exposure apparatus of claim 17; and performing exposure using said exposure apparatus.

* * * * *

UNITED STATES PATENT AND TRADEMARK OFFICE
CERTIFICATE OF CORRECTION

PATENT NO.     : 6,466,838 B1
DATED          : October 15, 2002
INVENTOR(S)    : Akio Aoki It is certified that error appears in the above-identified patent and that said Letters Patent is hereby corrected as shown below:

<u>Drawings,</u>
FIG. 6, "ITNERRUPTION" should read -- INTERRUPTION --.

<u>Column 7,</u>
Line 58, "has" should read -- have --.

<u>Column 11,</u>
Line 38, "erase" should read -- erases --.

<u>Column 14,</u>
Line 36, "appraise" should read -- apprise --.

Signed and Sealed this

Fifteenth Day of April, 2003

JAMES E. ROGAN
*Director of the United States Patent and Trademark Office*